United States Patent
Basker et al.

(10) Patent No.: US 9,893,171 B2
(45) Date of Patent: Feb. 13, 2018

(54) FIN FIELD EFFECT TRANSISTOR FABRICATION AND DEVICES HAVING INVERTED T-SHAPED GATE

(71) Applicant: INTERNATIONAL BUSINESS MACHINES CORPORATION, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/173,006

(22) Filed: Jun. 3, 2016

(65) Prior Publication Data
US 2017/0352744 A1    Dec. 7, 2017

(51) Int. Cl.
*H01L 29/66* (2006.01)
*H01L 29/423* (2006.01)
*H01L 29/49* (2006.01)
*H01L 29/78* (2006.01)
*H01L 29/40* (2006.01)
*H01L 21/311* (2006.01)
*H01L 21/3213* (2006.01)
*H01L 21/02* (2006.01)

(52) U.S. Cl.
CPC .... *H01L 29/66795* (2013.01); *H01L 21/0217* (2013.01); *H01L 21/02126* (2013.01); *H01L 21/02167* (2013.01); *H01L 21/31111* (2013.01); *H01L 21/31116* (2013.01); *H01L 21/32137* (2013.01); *H01L 29/401* (2013.01); *H01L 29/42376* (2013.01); *H01L 29/4966* (2013.01); *H01L 29/66545* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 5,241,203 A | 8/1993 | Hsu et al. | |
| 5,654,218 A | 8/1997 | Lee | |
| 6,674,139 B2 | 1/2004 | Mandelman et al. | |
| 7,452,768 B2 | 11/2008 | Min et al. | |
| 7,541,267 B1 | 6/2009 | Wang et al. | |
| 8,158,484 B2 | 4/2012 | Orlowski et al. | |
| 8,981,496 B2 | 3/2015 | Liu et al. | |

(Continued)

*Primary Examiner* — Whitney T Moore
(74) *Attorney, Agent, or Firm* — Tutunjian & Bitetto, P.C.; Vazken Alexanian

(57) ABSTRACT

A method of forming a fin field effect transistor (finFET), including forming a temporary gate structure having a sacrificial gate layer and a dummy gate layer on the sacrificial gate layer, forming a gate spacer layer on each sidewall of the temporary gate structure, forming a source/drain spacer layer on the outward-facing sidewall of each gate spacer layer, removing the dummy gate layer to expose the sacrificial gate layer, removing the sacrificial gate layer to form a plurality of recessed cavities, and forming a gate structure, where the gate structure occupies at least a portion of the plurality of recessed cavities.

14 Claims, 18 Drawing Sheets

(56) References Cited

U.S. PATENT DOCUMENTS

| | | | |
|---|---|---|---|
| 2006/0091490 A1* | 5/2006 | Chen | H01L 29/868 257/458 |
| 2008/0265343 A1 | 10/2008 | Greene et al. | |
| 2011/0278676 A1* | 11/2011 | Cheng | H01L 21/82380 257/369 |
| 2011/0291188 A1 | 12/2011 | Cheng et al. | |
| 2014/0077305 A1 | 3/2014 | Pathe et al. | |
| 2014/0239396 A1 | 8/2014 | Liu et al. | |
| 2014/0252496 A1 | 9/2014 | Liu et al. | |

* cited by examiner

FIN FIELD EFFECT TRANSISTOR FABRICATION AND DEVICES HAVING INVERTED T-SHAPED GATE

BACKGROUND

Technical Field

The present invention relates to fabricating a fin field effect transistor (finFET) structure with an inverted T-shaped gate, and more particularly to 3-dimensional construction of a plurality of fin field effect transistor (finFET) devices having an inverted T-shaped gate.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

As MOSFETs are scaled to smaller dimensions, designs and techniques are employed to improve device performance. Vertical fin transistors are attractive candidates for scaling to smaller dimensions. Vertical fin transistors may provide higher density scaling and allow for relaxed gate lengths to better control device electrostatics without sacrificing the gate contact pitch size.

SUMMARY

In accordance with an embodiment of the present principles, a method is provided for forming a fin field effect transistor (finFET). The method includes forming a temporary gate structure having a sacrificial gate layer and a dummy gate layer on the sacrificial gate layer, and forming a gate spacer layer on each sidewall of the temporary gate structure. The method further includes the step of forming a source/drain spacer layer on the outward-facing sidewall of each gate spacer layers, and removing the dummy gate layer to expose the sacrificial gate layer. The method further includes the step of removing the sacrificial gate layer to form a plurality of recessed cavities, and forming a gate structure, where the gate structure occupies at least a portion of the plurality of recessed cavities.

In accordance with an embodiment of the present principles, a method is provided for forming a vertical fin field effect transistor (finFET). The method includes forming a sacrificial gate layer on one or more fins on a substrate, and forming a dummy gate layer on at least a portion of the sacrificial gate layer. The method further includes the step of forming a gate spacer layer on the sidewalls of the dummy gate layer, and removing at least a portion of the sacrificial gate layer from a portion of the one or more fins. The method further includes the step of forming a source/drain spacer layer on the outward-facing sidewalls of the gate spacer layers and sacrificial gate layer, and removing the dummy gate layer to expose the inward-facing sidewalls of the gate spacer layers and the sacrificial gate layer between the gate spacer layers. The method further includes removing the remaining portion of the sacrificial gate layer on the one or more fins to form a plurality of recessed cavities, and forming a gate structure on the one or more fins, wherein the gate structure occupies the plurality of recessed cavities.

In accordance with another embodiment of the present principles, a fin field effect transistor (finFET) having an inverted-T gate is provided. The finFET includes a first gate spacer layer and a first source/drain spacer layer on one or more fins, wherein the first gate spacer layer is adjacent to the first source/drain spacer layer. The finFET further includes a second gate spacer layer and a second source/drain spacer layer on the one of the one or more fins, wherein the second gate spacer layer is adjacent to the second source/drain spacer layer, and the first gate spacer layer is opposite the second gate spacer layer. The finFET further includes a gate structure formed between the first gate spacer layer and the second gate spacer layer, where a portion of the gate structure fills a first recessed cavity in the first gate spacer layer and a second recessed cavity in the second gate spacer layer to define a gate length.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
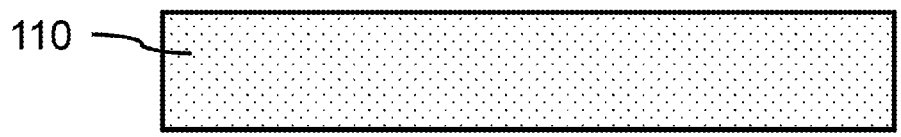
FIG. 1 is a cross-sectional side view of a substrate, in accordance with an exemplary embodiment.

Principles and embodiments of the present disclosure relate generally to a fabrication approach to form a fin field effect transistor (finFET) with an inverted T-shaped gate structure, or more specifically a finFET with an inverted T-shaped gate structure formed using a sacrificial spacer to provide a recessed cavity. In various embodiments, the current flows horizontally through the fin of the finFET.

Principles and embodiments also relate to forming one or more fin field effect transistors (finFETs), wherein short channel effects (SCE) are alleviated by increasing the gate length on the fin through use of a sacrificial gate layer. The sacrificial gate layer may be situated between a surface of a fin and an overlying gate spacer layer to act as a temporary filler to create a cavity.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Referring now to the drawings in which like numerals represent the same or similar elements and initially to FIG. 1, which is a cross-sectional side view of a substrate, in accordance with an exemplary embodiment.

In one or more embodiments, a substrate 110 may be a semiconductor. The substrate may be crystalline. The substrate may be essentially (i.e., except for contaminants) a single element (e.g., silicon), primarily of a single element (i.e., with doping), for example, silicon (Si) or germanium (Ge), or the substrate may be a compound semiconductor, for example, a III-V compound semiconductor (e.g., GaAs), SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). In one or more embodiments, the substrate 110 may be a silicon wafer. In various embodiments, the substrate is a single crystal silicon wafer. A single crystal silicon substrate may be used for epitaxial growth of a fin to form a FET channel. In various embodiments, the substrate may be an undoped, intrinsic semiconductor.

Figure 2:
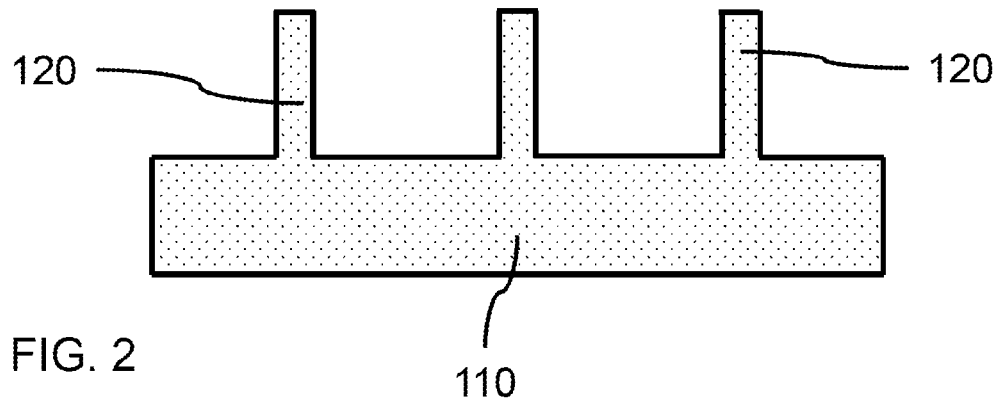
FIG. 2 is a cross-sectional side view of a substrate with a plurality of fins extending from the surface of the substrate, in accordance with an exemplary embodiment.

FIG. 2 is a cross-sectional side view of a substrate with a plurality of fins extending from the surface of the substrate, in accordance with an exemplary embodiment.

In one or more embodiments, one or more fins 120 may be formed on a substrate 110, where the fins may extend vertically from the substrate. The fin(s) 120 may have a long axis, which may be along the direction of intended current flow. The long axis of the fin(s) 120 may be parallel with the plane of the substrate. The fin(s) 120 may have a short axis, which may be perpendicular to the long axis and direction of intended current flow, where the short axis also may be parallel to the plane of the substrate 110. A plurality of fins 120 may be arranged parallel to one another on the same region of the substrate 110, where each of the fins 120 may be the same length and have the same orientation.

In various embodiments, the one or more fins 120 may be formed on a substrate by a growth process, for example, epitaxial growth on exposed portions of the substrate surface; or by a removal process, for example, masking, patterning, and developing a soft mask layer, and etching into the substrate 110. In various embodiments, a soft mask layer may be a temporary resist (e.g., PMMA) that may be deposited, patterned, and developed. The soft mask layer may be a positive resist or a negative resist. One or more openings may be patterned in the soft mask layer for forming the fins 120.

In various embodiments, the substrate may be masked with a soft mask (e.g., PMMA, organic planarization layer (OPL), or organic dielectric layer (ODL)), which is patterned and developed to expose portions of the substrate, and an etching processes, for example, a reactive ion beam etching (RIE) process may be used to remove portions of the substrate to form a plurality of fins 120 extending perpendicularly away from the surface of the substrate 110. In other embodiments, a dummy layer may be formed on the substrate 110, and a soft mask (e.g., PMMA, OPL, or ODL) may be formed on the dummy layer. The soft mask may be patterned and developed to expose portions of the dummy layer, and trenches formed in the dummy layer down to the substrate surface. A plurality of fins 120 may be grown on the substrate surface, for example, by an epitaxial deposition process, and the dummy layer may be removed to expose free-standing fins.

In various embodiments, a sidewall image transfer (SIT) technique may be used to form one or more vertical fins 120 on the substrate. In a typical SIT process, spacers are formed on the sidewall of a sacrificial mandrel. The sacrificial mandrel is removed and the remaining upright spacers are used to pattern hardmask fin template(s). The hardmask fin template(s) are used as a mask during the etch of the top semiconductor layer to form one or more vertical fins 120. The upright spacers are then removed after the semiconductor vertical fins 120 have been formed. In various embodiments, the substrate may be a single crystal Si substrate and the vertical fins may be single crystal silicon.

In one or more embodiments, the fins 120 may have the same composition and crystal structure as the substrate 110. In various embodiments, the fins may have a different chemical composition, but essentially the same crystal structure as the substrate, for example, where a silicon germanium (SiGe) or silicon carbide (SiC) fin is epitaxially grown on a silicon single crystal substrate, or a gallium arsenide (GaAs) fin is grown on a germanium (Ge) substrate, for example, by molecular beam heteroepitaxy.

In one or more embodiments, the fins may have a width in the range of about 6 nm to about 20 nm, or may have a width in the range of about 8 nm to about 15 nm, or may have a width in the range of about 10 nm to about 12 nm.

In various embodiments, the number of adjacent fins formed on a portion of the substrate may be predetermined based on the amount of current to be handled by the device, where a plurality of fins 120 may be ganged together in parallel to form a single device with greater current capacity.

Figure 3:
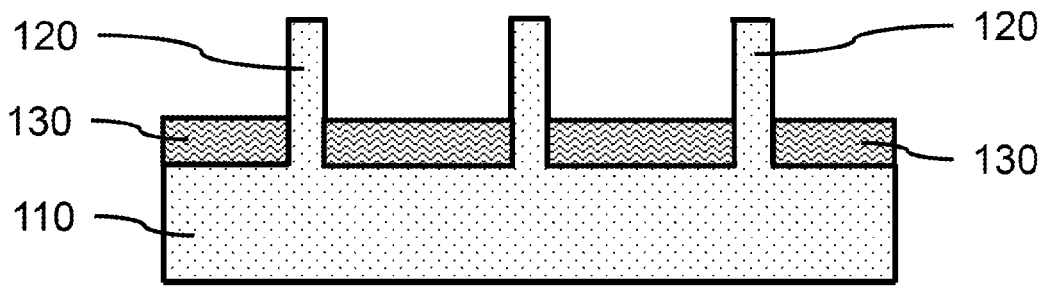
FIG. 3 is a cross-sectional side view of a plurality of fins and a bottom spacer layer, in accordance with an exemplary embodiment.

FIG. 3 is a cross-sectional side view of a plurality of fins and a bottom spacer layer, in accordance with an exemplary embodiment.

In one or more embodiments, a bottom spacer layer 130 may be formed on a exposed surface of the substrate 110. The bottom spacer layer 130 may be a dielectric material other than a high-K dielectric, for example, silicon oxide (SiO), silicon nitride (SiN), silicon oxynitride (SiON), or boron nitride (BN). The bottom spacer layer 130 may be deposited by chemical vapor deposition (CVD), physical layer deposition (PVD), atomic layer deposition (ALD), as well as combinations thereof. The bottom spacer layer 130 may provide electrical isolation between the substrate 110 and a gate structure on the fin(s) 120.

In one or more embodiments, the bottom spacer layer 130 may have a thickness in the range of about 2 nm to about 10 nm, or in the range of about 2 nm to about 5 nm. The thickness of the bottom spacer layer 130 may define the distance of a bottom edge of a gate structure from the substrate 110.

Figure 4:
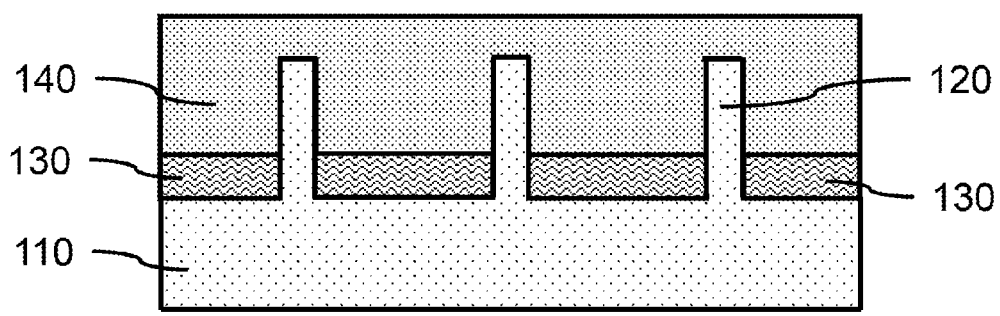
FIG. 4 is a cross-sectional side view of a plurality of fins, a bottom spacer layer, and a dielectric cover layer, in accordance with an exemplary embodiment.

FIG. 4 is a cross-sectional side view of a plurality of fins, a bottom spacer layer, and a dielectric cover layer, in accordance with an exemplary embodiment.

In one or more embodiments, a dielectric cover layer 140 may be formed on the fins 120 and bottom spacer layer 130. In various embodiments, the dielectric cover layer 140 may be blanket deposited, conformally deposited (e.g., ALD, CVD), or a combination thereof. A blanket dielectric cover layer 140 may extend above the height of the fins 120. A conformally deposited dielectric cover layer 140 may cover the top surface and sidewalls of the fins 120.

In one or more embodiments, the dielectric cover layer 140 may be formed by ALD or PVD to provide a high quality oxide. In various embodiments, the dielectric cover layer 140 may be an EG oxide for high voltage/high current devices in an integrated circuit, where the fabricated device may be used for input/output circuitry.

In various embodiments, the dielectric cover layer 140 may have a thickness in the range of about 7 nm to about 15 nm, or in the range of about 8 nm to about 12 nm, or in the range of about 8 nm to about 10 nm.

Figure 5:
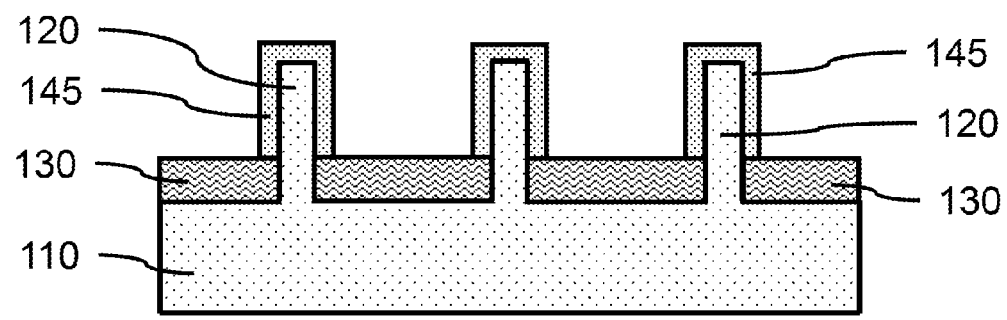
FIG. 5 is a cross-sectional side view of a plurality of fins, a bottom spacer layer, and a partially removed dielectric cover layer in accordance with an exemplary embodiment.

FIG. 5 is a cross-sectional side view of a plurality of fins, a bottom spacer layer, and a partially removed cover layer in accordance with an exemplary embodiment.

In various embodiments, a portion of the dielectric cover layer 140 may be removed. A portion of the dielectric cover layer 140 may be removed from the space between neighboring fins 120, where the dielectric cover layer 140 may be etched to expose the surface of the bottom spacer layer 130.

In various embodiments, a mask may be formed and patterned on the dielectric cover layer 140, to selectively remove portions of the dielectric cover layer 140. The remaining portion of the dielectric cover layer 140 may form a sacrificial gate layer 145, where the sacrificial gate layer may be part of a dummy gate structure on fin(s) 120.

In various embodiments, the dielectric cover layer 140 may be silicon oxide (SiO), silicon nitride (SiN), silicon oxynitride (SiON), or a combination thereof. The material of the dielectric cover layer 140 may be different from and selectively etchable over the material of fin 120, a dummy gate layer, gate spacer layer, and/or source/drain spacer layer.

In one or more embodiments, the height of the dielectric cover layer 140 may be reduced by a chemical-mechanical polishing (CMP), for example where a blanket deposited dielectric cover layer 140 extends above the height of the fin(s) 120.

In various embodiments, for example, in which the dielectric cover layer 140 is formed by a conformal deposition on the fin(s) 120 and the exposed surface of the bottom spacer layer 130, the dielectric cover layer 140 may be formed to a predetermined thickness. Portions of the dielectric cover layer 140 on the surface of the bottom spacer layer between neighboring fins 120 may be selectively removed to form a sacrificial gate layer 145 on the fin(s) 120.

In one or more embodiments, the sacrificial gate layer 145 may have a thickness in the range of about 7 nm to about 15 nm, or in the range of about 8 nm to about 12 nm, or in the range of about 8 nm to about 10 nm.

Figure 6:
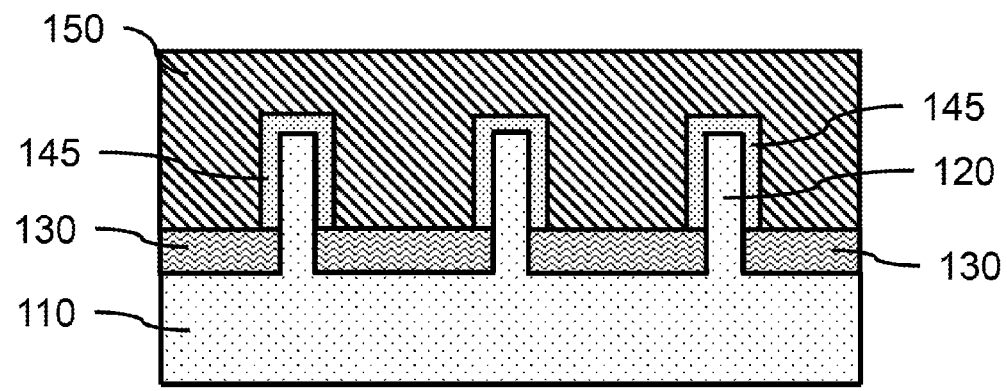
FIG. 6 is a cross-sectional side view of a dummy gate layer over the partially removed cover layer, plurality of fins, and bottom layer in accordance with an exemplary embodiment.

FIG. 6 is a cross-sectional side view of a dummy gate layer over the partially removed cover layer, plurality of fins, and bottom layer in accordance with an exemplary embodiment.

In one or more embodiments, a dummy gate layer 150 may be formed on the bottom spacer layer 130 and the sacrificial gate layer 145. The dummy gate layer 150 may extend in a plane across the long axis of one or more fins 120, where the dummy gate layer 150 may be perpendicular to the one or more fin(s) 120. The dummy gate layer 150 and sacrificial gate layer 145 may form a temporary gate structure.

The dummy gate layer 150 may be a semiconductor material including but not limited to amorphous silicon (a-Si) or polycrystalline silicon (p-Si). In one or more embodiments, the dummy gate layer 150 may be formed by PVD.

In one or more embodiments, the dummy gate layer 150 may have a width in the range of about 10 nm to about 50 nm, or in the range of about 10 nm to about 30 nm, or in the range of about 12 nm to about 18 nm. The width of the dummy gate layer 150 provides a gate on the vertical fin(s), with a length $L_{gate}$, in the range of about 10 nm to about 50 nm, or in the range of about 10 nm to about 30 nm, or in the range of about 12 nm to about 18 nm. In one or more embodiments, the width of the dummy gate layer 150 defines the length of the gate, $L_{gate}$, on fin(s) 120.

In one or more embodiments, the dummy gate layer 150 may have a height in the range of about 50 nm to about 120 nm, or in the range of about 40 nm to about 90 nm.

Figure 7:
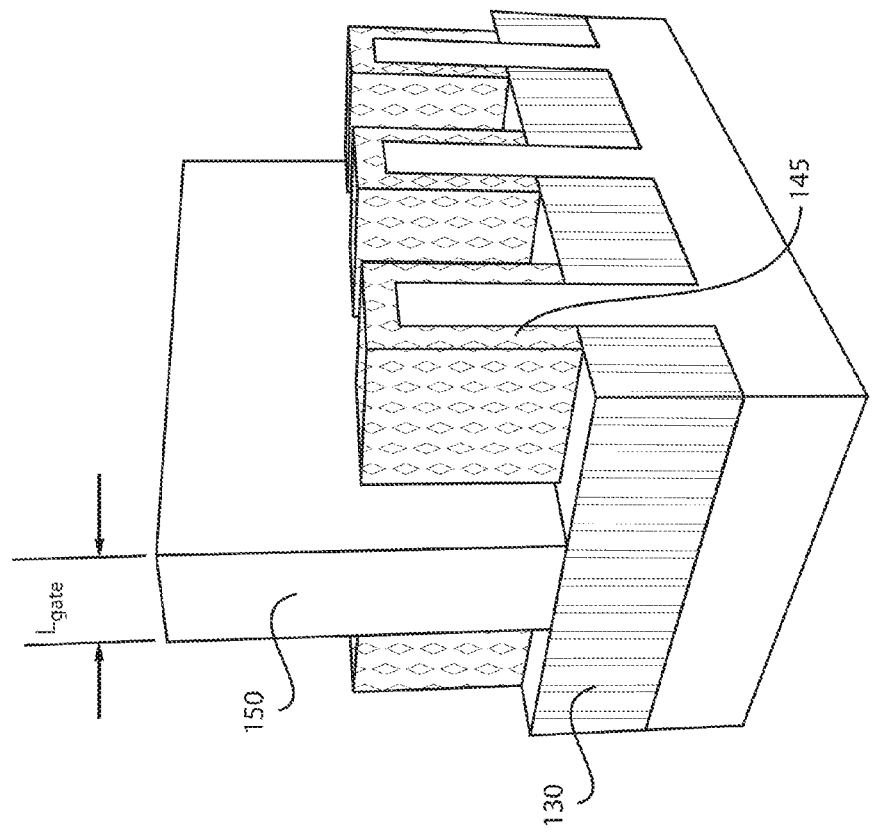
FIG. 7 is a 3D perspective view of a dummy gate layer on a dielectric cover layer over a plurality of fins in accordance with an exemplary embodiment.

FIG. 7 is a 3D perspective view of a dummy gate layer on a dielectric cover layer over a plurality of fins in accordance with an exemplary embodiment.

In one or more embodiments, the dummy gate layer 150 covers a plurality of vertical fins 120 and a bottom spacer layer 130 formed on substrate 110. The materials of the dummy gate layer 150 may be chosen to allow selective removal of the sacrificial gate layer 145, while leaving the gate dummy layer.

Figure 8:
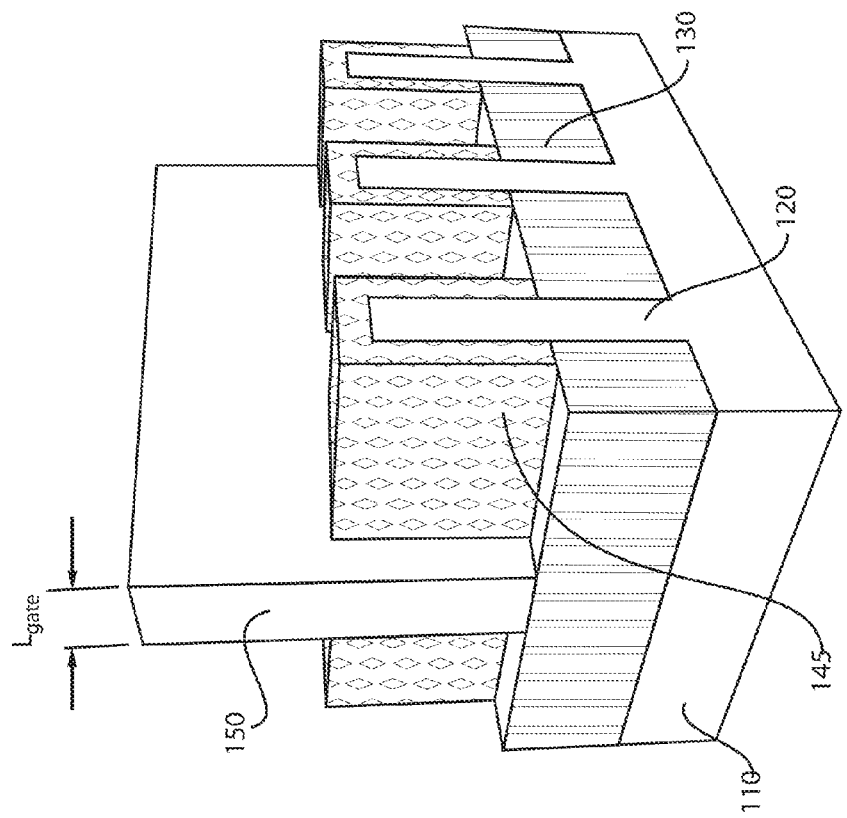
FIG. 8 is a 3D perspective view of a dummy gate layer on a dielectric cover layer over a plurality of fins in accordance with an exemplary embodiment.

FIG. 8 is a 3D perspective view of a dummy gate layer on a dielectric cover layer over a plurality of fins in accordance with an exemplary embodiment.

In various embodiments, the width of the dummy gate layer 150 may be less than a final intended gate length, $L_{gate}$, where a portion of the sacrificial gate layer 145 may be utilized to form a longer gate adjacent to the fin, while maintaining a narrower $L_{gate}$ at a distance removed from the fin. Defining the gate length may allow adjustment of the effective current and short-channel characteristics of the vertical FET device, for example drain-induced barrier lowering (DIBL). In various embodiments, additional characteristics of the vertical FET device, including the threshold voltage, Vt, of the device may be determined by the work function metal and/or the high-k dielectric material (e.g., gate stack material/structure).

Figure 9:
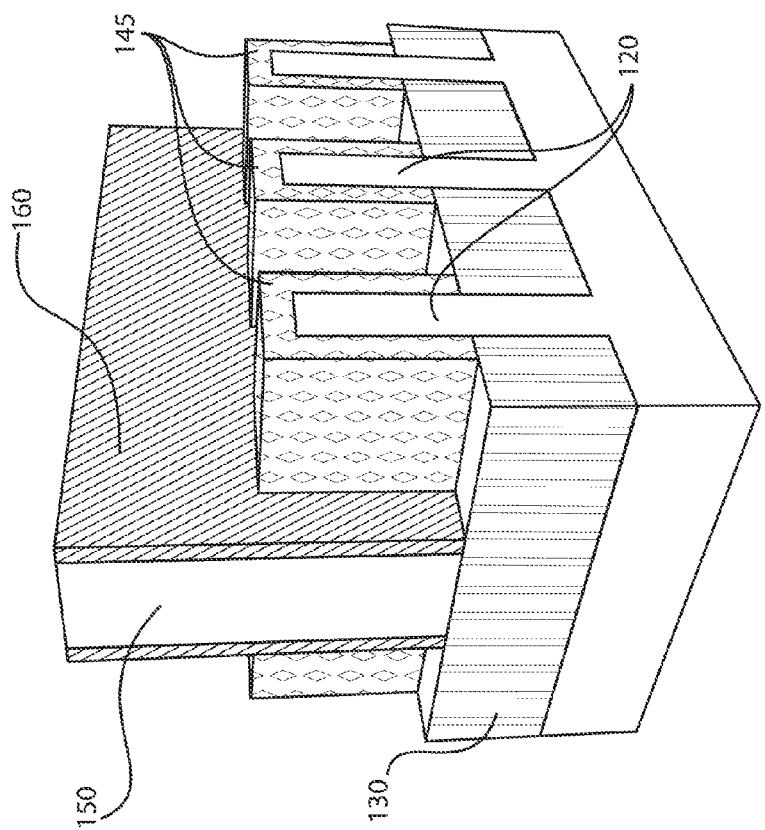
FIG. 9 is a 3D perspective view of gate spacer layers adjacent to the dummy gate layer over a plurality of fins in accordance with an exemplary embodiment.

FIG. 9 is a 3D perspective view of gate spacer layers adjacent to the dummy gate layer over a plurality of fins in accordance with an exemplary embodiment.

In one or more embodiments, a gate spacer layer 160 may be formed on the outward-facing vertical sidewalls of the dummy gate layer 150. The gate spacer layer 160 may physically separate the dummy gate layer 150 from other components of the finFET. The gate spacer layer 160 may also act as an etch stop to prevent or limit the lateral etching of the sacrificial gate layer 145 towards the dummy gate layer 150.

In various embodiments, the gate spacer layer 160 may be a low-K dielectric material, for example, silicon nitride (SiN), silicon oxycarbonitride (SiOCN), silicon boron carbonitride (SiBCN), or combinations thereof. The gate spacer layer 160 may have a thickness in the range of about 1.5 nm to about 3 nm.

In various embodiments the gate spacer layer 160 may be formed on the outward-facing sidewalls of the dummy gate layer 150 and over the sacrificial gate layer 145. An RIE may be used to directionally etch exposed portions of the gate spacer layer 160. When a directional dry etch (e.g., RIE) is performed, the gate spacer layer 160 may be removed from around the sacrificial fin layer 145, and the bottom spacer layer 130 and the sacrificial layer 145 may act as an etch stop for the RIE.

Figure 10:
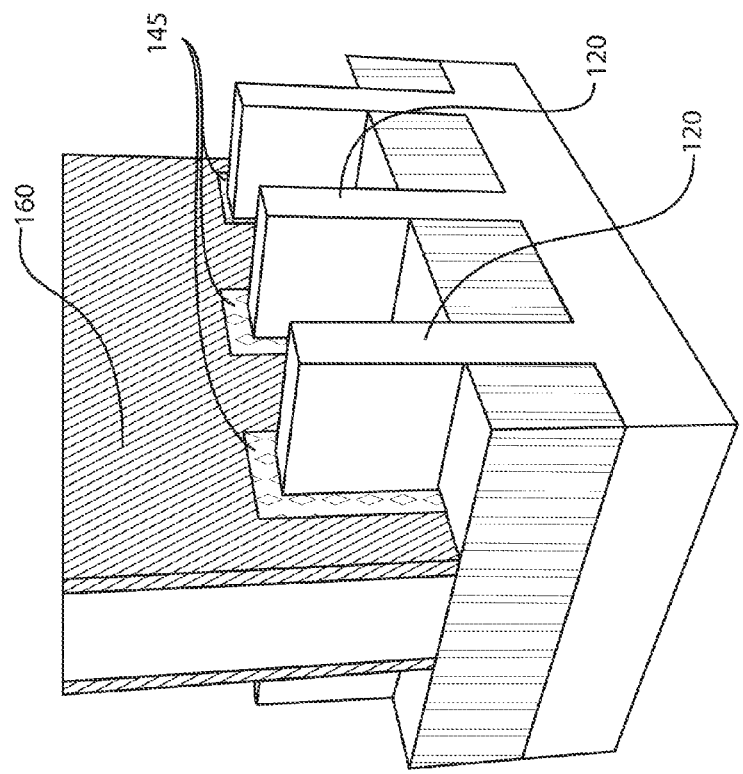
FIG. 10 is a 3D perspective view of gate spacer layers on the dummy gate layer over a plurality of fins, and partially removed sacrificial gate layers, in accordance with an exemplary embodiment.

FIG. 10 is a 3D perspective view of gate spacer layers on the dummy gate layer over a plurality of fins, and partially removed sacrificial gate layers, in accordance with an exemplary embodiment.

In one or more embodiments, the sacrificial gate layer 145 extending laterally outward from the gate spacer layer 160 over the fin(s) 120 may be removed to expose portions of the fin(s) 120 that are not covered by the gate spacer layer 160 and/or dummy gate layer 150. A remaining portion of the sacrificial gate layer 145 may be below the gate spacer layer 160 and dummy gate layer 150 after removal of the exposed portion of the sacrificial gate layer 145. The gate spacer layer 160 may be a material different from the sacrificial gate layer 145, and may act as an etch stop to protect at least a portion of the sacrificial gate layer 145 covered by the gate spacer layer 160. In various embodiments, portions of the sacrificial gate layer 145 may be removed by RIE, where the directionality of the RIE maintains the vertical faces of the sacrificial gate layer 145 and gate spacer layer 160. The top surfaces of the bottom spacer layer 130 may be further exposed after removal of the sacrificial gate layer 145 from the portion of the fins 120.

Figure 11:
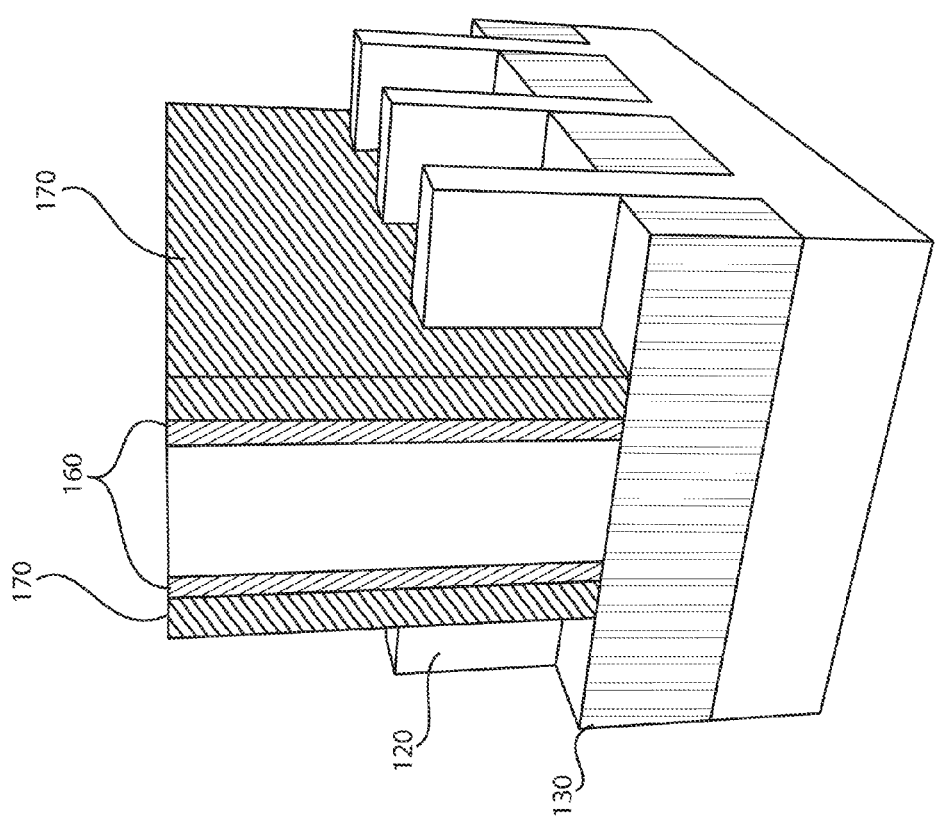
FIG. 11 is a 3D perspective view of a source/drain spacer layer on the gate spacer layer and a plurality of fins, in accordance with an exemplary embodiment.

FIG. 11 is a 3D perspective view of a source/drain spacer layer on the gate spacer layer and a plurality of fins, in accordance with an exemplary embodiment.

In one or more embodiments, a source/drain spacer layer 170 may be formed on the outward-facing vertical sidewalls of the gate spacer layer(s) 160 and on at least a portion of the exposed fins 120. The source/drain spacer layer 170 may physically separate the dummy gate layer 150 and/or gate spacer layer 160 from other components of the finFET. The source/drain spacer layer 170 may cover the vertical surface of the remaining sacrificial gate layer 145 and gate spacer layer 160, and physically separate the sacrificial gate layer 145 from a source/drain subsequently formed on the fin(s) 120.

In various embodiments, the gate spacer layer(s) 160 and a source/drain spacer layer(s) 170 may extend in a plane across the long axis of the one or more fins 120. The gate spacer layer(s) 160 and a source/drain spacer layer(s) 170 may be parallel to and coextensive with the dummy gate layer 150, and perpendicular to the substrate 110 and fin(s) 120. The gate spacer layer 160 and a source/drain spacer layer 170 may be on at least a portion of one or more fin(s) 120.

In various embodiments, the source/drain spacer layer 170 may be a dielectric material, for example, silicon nitride (SiN), silicon oxycarbonitride (SiOCN), silicon boron carbonitride (SiBCN), or combinations thereof. The source/drain spacer layer 170 may be a material the same as or different from the gate spacer layer 160. The source/drain spacer layer 170 may have a thickness in the range of about 4 nm to about 8 nm, or in the range of about 5 nm to about 6 nm.

In one or more embodiments, the source/drain spacer layer 170 may be formed by a blanket deposition on the exposed portions of the fin(s) 120. A directional etch, for example RIE, may be used to remove portions of the source/drain spacer layer 170 on the horizontal surfaces of the fin(s) 120 and bottom spacer 130, while leaving vertical walls adjacent to and in contact with the gate spacer layer 160. When a directional dry etch (e.g., RIE) is performed, the source/drain spacer layer 170 may be removed from around the fin(s) 120, where the bottom spacer layer 130 may act as an etch stop for the RIE.

In various embodiments, the source/drain spacer layer 170 encloses the remaining portion of the sacrificial gate layer 145 between the dummy gate layer 150 and the gate spacer layer 160. The portion of the sacrificial gate layer 145 between the dummy gate layer 150 and the gate spacer layer 160 may act as a sacrificial spacer that can be removed to increase the length of a gate on the fin(s) 120.

Figure 12:
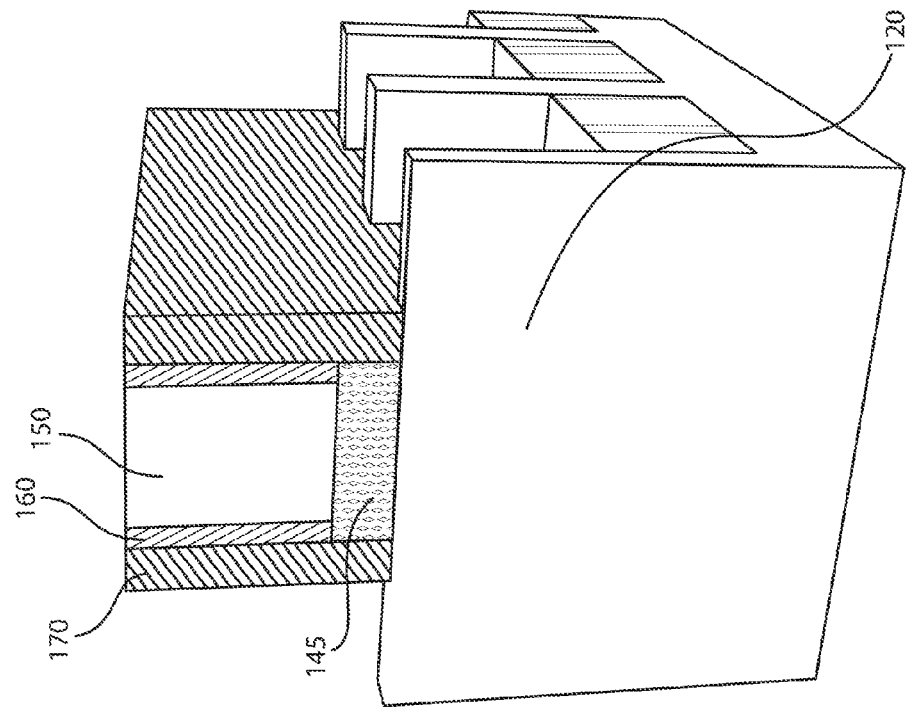
FIG. 12 is a 3D perspective view of a cross-section of a fin, sacrificial gate layer, gate spacer layer, and source/drain spacer layer, in accordance with an exemplary embodiment.

FIG. 12 is a 3D perspective view of a cross-section of a fin, sacrificial gate layer, gate spacer layer, and source/drain spacer layer, in accordance with an exemplary embodiment.

In one or more embodiments, the sacrificial gate layer 145 physically separates the dummy gate layer 150 and the gate spacer layer 160 from the top and side surfaces of the fin 120. The gate spacer layer 160 may be on the sacrificial gate layer 145 and sandwiched between the dummy gate layer 150 and the source/drain spacer layer 170. The source/drain spacer layer 170 may be on the fin 120 and adjacent to and in contact with the gate spacer layer 160 and sacrificial gate layer 145.

In various embodiments, the sacrificial gate layer 145 may be selectively removed to form a wider gate area adjacent to the top and/or side surface(s) of the fin(s) 120, where the sacrificial gate layer 145 may act as a temporary filler to create a recessed cavity.

Figure 13:
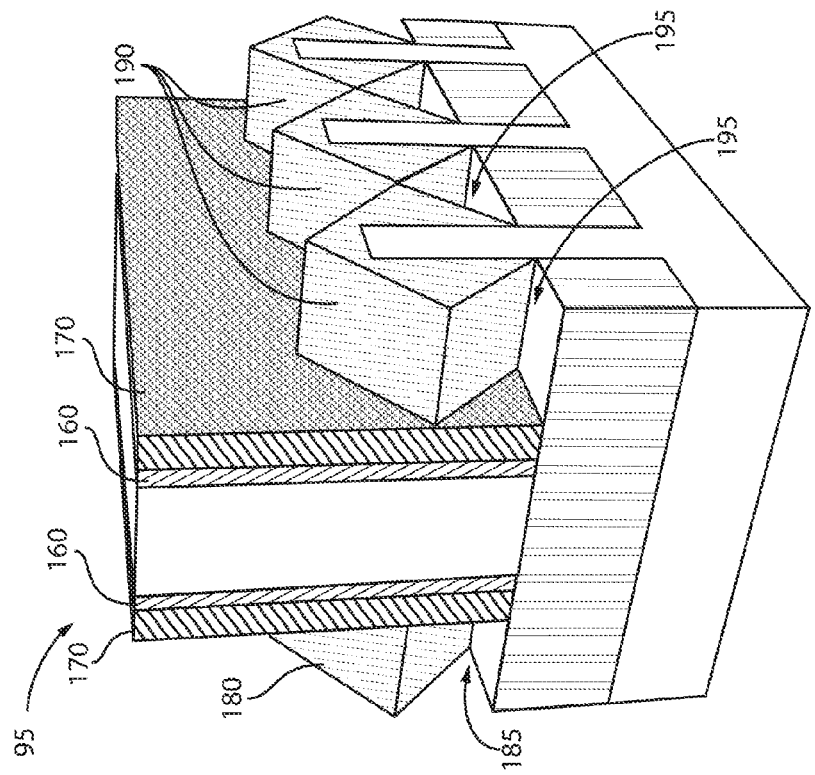
FIG. 13 is a 3D perspective view of source/drains formed on the fins adjacent to the source/drain spacer layers, in accordance with an exemplary embodiment.

FIG. 13 is a 3D perspective view of source/drains formed on the fins adjacent to the source/drain spacer layers, in accordance with an exemplary embodiment.

In one or more embodiments, a plurality of source/drains may be formed on the one or more fins 120, where a source/drain 180, 190 may be formed on opposite ends of each fin 120. A source/drain 180, 190 may be formed on each of the one or more fin(s) 120 adjacent to the outward-facing sidewalls of the source/drain spacer layers, where the fin forms a channel of a finFET configured to have current flow parallel to the plane of the substrate from one end of the fin to the other end. A gate structure may be formed around at least a portion of the fin 120 to control current from between a source and a drain. In various embodiments, the locations of the source and drain of the transistor may be reversed, such that the drain and source are on the opposite ends of the vertical fin.

In various embodiments, the source/drains 180, 190 may be formed by epitaxial growth on the exposed faces of the fins 120 above the bottom spacer layer 130, where each source/drain 180 and/or source/drain 190 may be on a portion of a fin 120. The fins 120 may be crystalline with predetermined crystal faces exposed on the sides and top of the fins 120, where the crystal faces may determine the crystal orientation and growth rates of the source/drains 180, 190 during epitaxial growth. In various embodiments, the source/drains 180, 190 may be the same as or different from the material of fin(s) 120. The source/drain may be doped in-situ during epitaxial growth or may be doped ex-situ.

In one or more embodiments, the neighboring source/drain(s) 190 on one side of the dummy gate layer 150 may grow together to form a single merged source/drain. The neighboring source/drain(s) 180 on the opposite side of the dummy gate layer 150 may also grow together to form a single merged source/drain. The neighboring source/drain(s) 190 on one side of the dummy gate layer may be joined together, and the source/drain(s) 180 on the opposite side of the dummy gate layer may be joined together to gang the neighboring fins into a single transistor device. A single transistor device 95 with a single merged source and a single merged drain electrically coupled to multiple fins may, thereby, provide greater current capacity.

In various embodiments, neighboring source/drain(s) 190 grown together may form void spaces 185, 195 between the source/drain(s) 180, 190 and the exposed surface of the bottom spacer layer 130 between the fins.

In various embodiments, the source/drains 180, 190 may be doped in-situ, as the source/drains 180, 190 are formed on the fins 120, or the source/drains 180, 190 may be doped ex-situ, for example, by ion implantation, after the source/drains 180, 190 are formed on the fins 120. The source/drains 180, 190 may be n-doped semiconductor material to form an NFET, or p-doped semiconductor material to form a PFET. In various embodiments, the doping concentration for the source/drain(s) 180, 190 may be in the range of about $1 \times 10^{19}/cm^3$ to about $6 \times 10^{22}/cm^3$, or in the range of about $1 \times 10^{20}/cm^3$ to about $1 \times 10^{22}/cm^3$. The fins 120 may be suitably doped to form an NFET or PFET.

Figure 14:
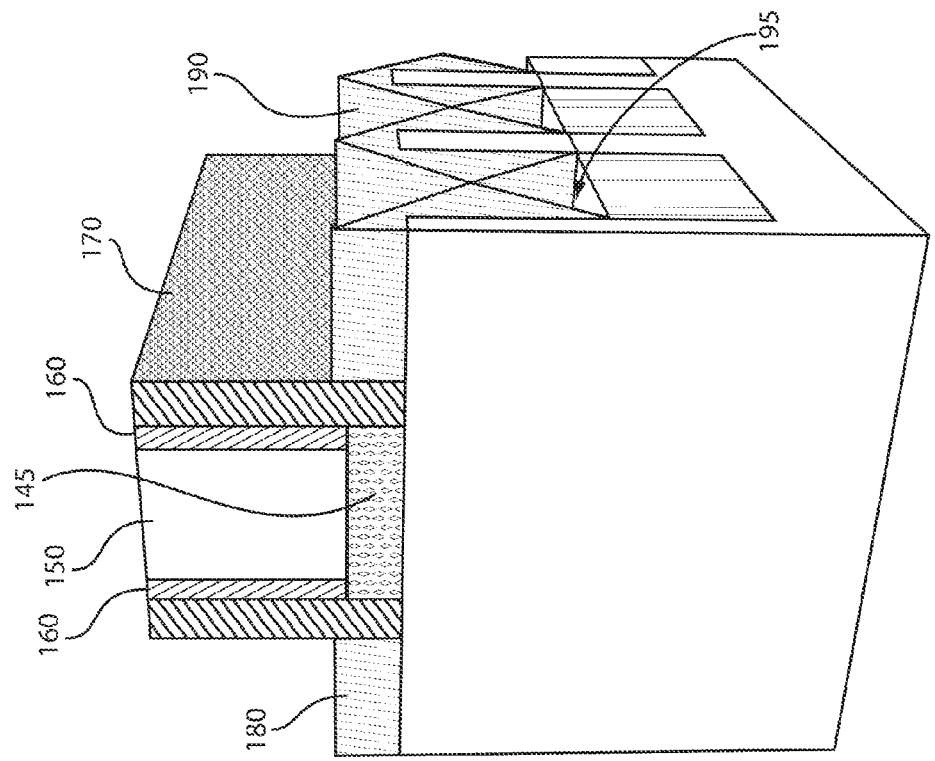
FIG. 14 is a 3D perspective view of a cross-section of a fin, sacrificial gate layer, source/drain spacer layers, and source/drains, in accordance with an exemplary embodiment.

FIG. 14 is a 3D perspective view of a cross-section of a fin, sacrificial gate layer, and source/drain, in accordance with an exemplary embodiment.

In one or more embodiments, the source/drain spacer layer 170 physically separates the source/drains 180, 190 from the sacrificial gate layer 145, and the gate spacer layer and source/drain spacer layer are intervening layers between the source/drains 180, 190 and the dummy gate layer 150.

In various embodiments, the width of the sacrificial gate layer 145 is greater than the width of the dummy gate layer 150 by the widths of the two gate spacer layers 160. The two gate spacer layers 160 provide a controlled adjustment to the gate length, $L_{gate}$, on and adjacent to the fin 120, where the gate length on and adjacent to the fin may be greater than an upper portion of a gate by about 3 nm to about 6 nm.

Figure 15:
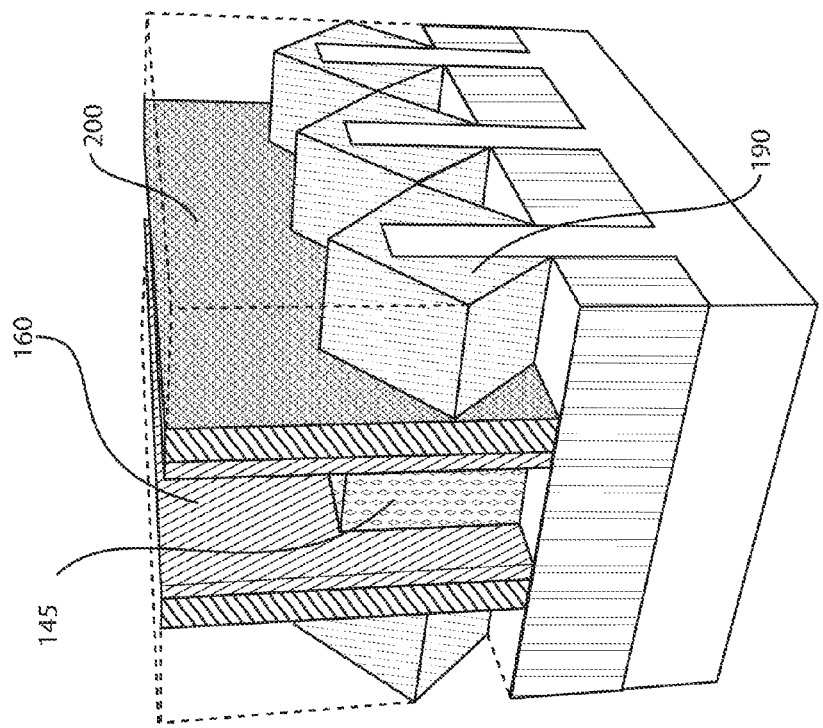
FIG. 15 is a 3D perspective view of an exposed sacrificial gate layer over a portion of a fin after removal of the dummy gate layer, in accordance with an exemplary embodiment.

FIG. 15 is a 3D perspective view of an exposed sacrificial gate layer over a portion of a fin after removal of the dummy gate layer, in accordance with an exemplary embodiment.

In one or more embodiments, a protective layer 200 may be formed over the source/drain(s) 180, 190 to protect the source/drain(s) 180, 190 during removal of the dummy gate layer 150. In various embodiments, the protective layer 200 may be a field oxide (FOX), for example, thermal silicon dioxide ($SiO_2$). In various embodiments, the ends and/or end sidewalls of the fins 120 may be covered by a nitride cap to avoid formation of the other layers on the ends of the fins 120.

In one or more embodiments, the dummy gate layer 150 may be selectively removed to expose the underlying portion of the sacrificial gate layer 145 between the gate spacer layers 160, and the inward-facing sidewalls of the gate spacer layer 160. The dummy gate layer 150 may be selectively removed using a RIE, or a combination of RIE with a wet etch.

Figure 16:
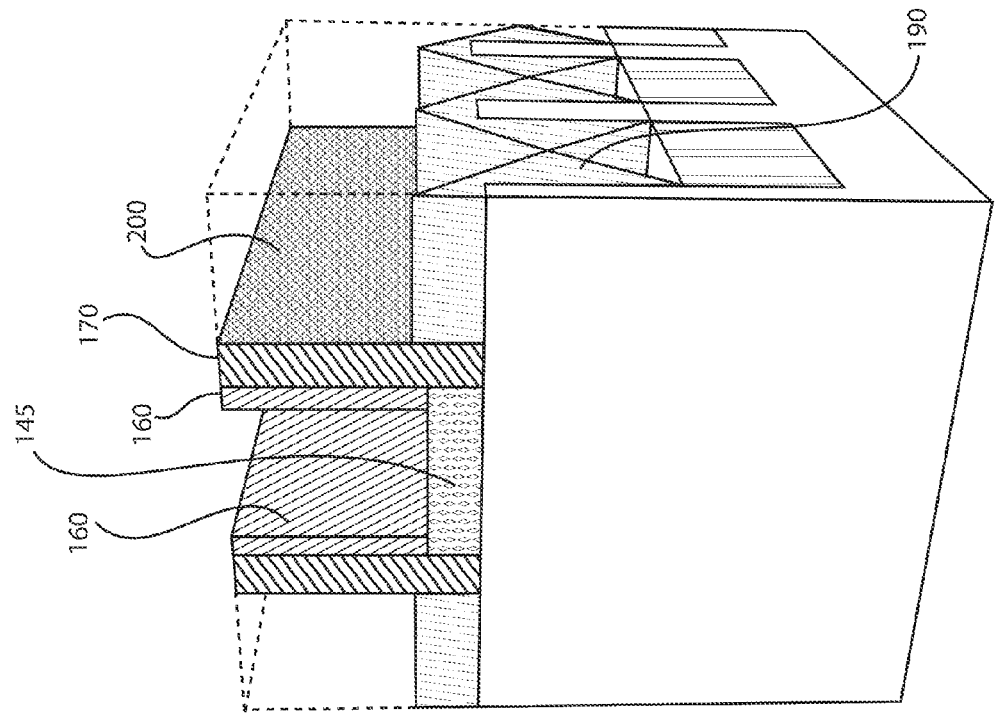
FIG. 16 is a 3D perspective view of a cross-section of a fin, sacrificial gate layer, and protective layer on source/drains, in accordance with an exemplary embodiment.

FIG. 16 is a 3D perspective view of a cross-section of a fin, sacrificial gate layer, and protective layer on source/drains, in accordance with an exemplary embodiment.

In one or more embodiments, the removal of the dummy gate layer 150 exposes the top and side surfaces of the sacrificial gate layer 145 for subsequent removal. The protective layer 200, which may be a dielectric material, may protect the source/drain(s) 180, 190 during removal of the dummy gate layer 150 and sacrificial gate layer 145.

Figure 17:
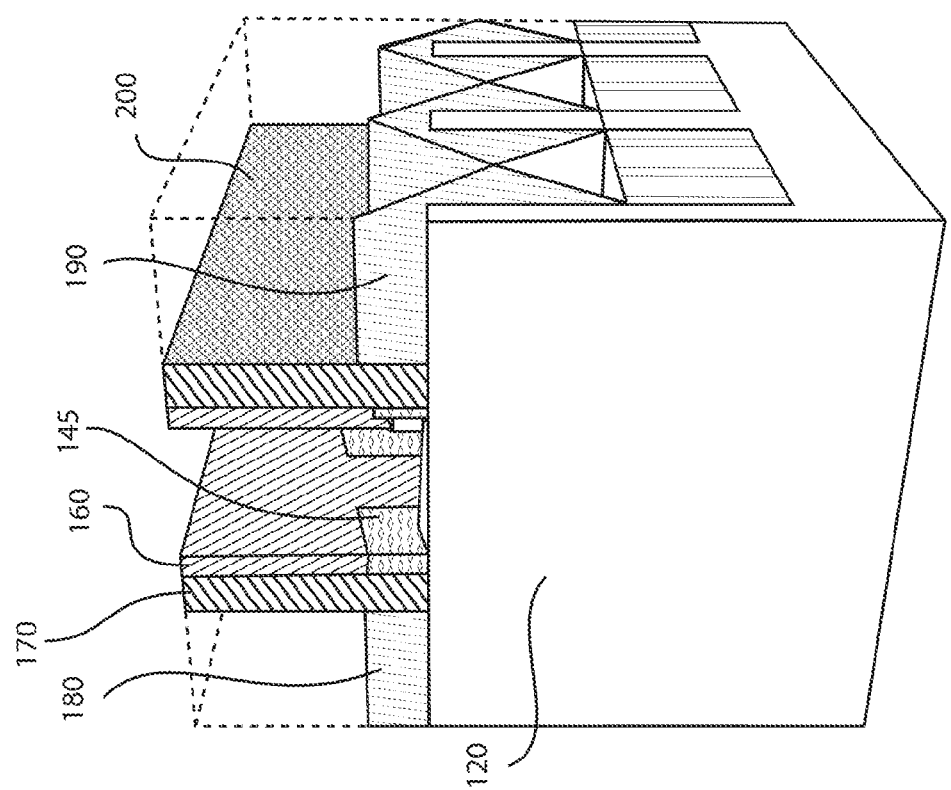
FIG. 17 is a 3D perspective view of an exposed fin under a remaining portion of a sacrificial gate layer after removal of a portion of
the sacrificial gate layer on the fin, in accordance with an exemplary embodiment.

FIG. 17 is a 3D perspective view of an exposed fin under a remaining portion of a sacrificial gate layer after removal of the sacrificial gate layer on the fin, in accordance with an exemplary embodiment.

In one or more embodiments, the fin 120 forming a channel of a finFET is at least partially exposed after removing the portion of the sacrificial gate layer 145 between the gate spacer layers 160. The gate spacer layers 160 may mask at least a portion of the sacrificial gate layer 145 during a directional etching (e.g., RIE) of the sacrificial gate layer 145 between the gate spacer layers 160.

Figure 18:
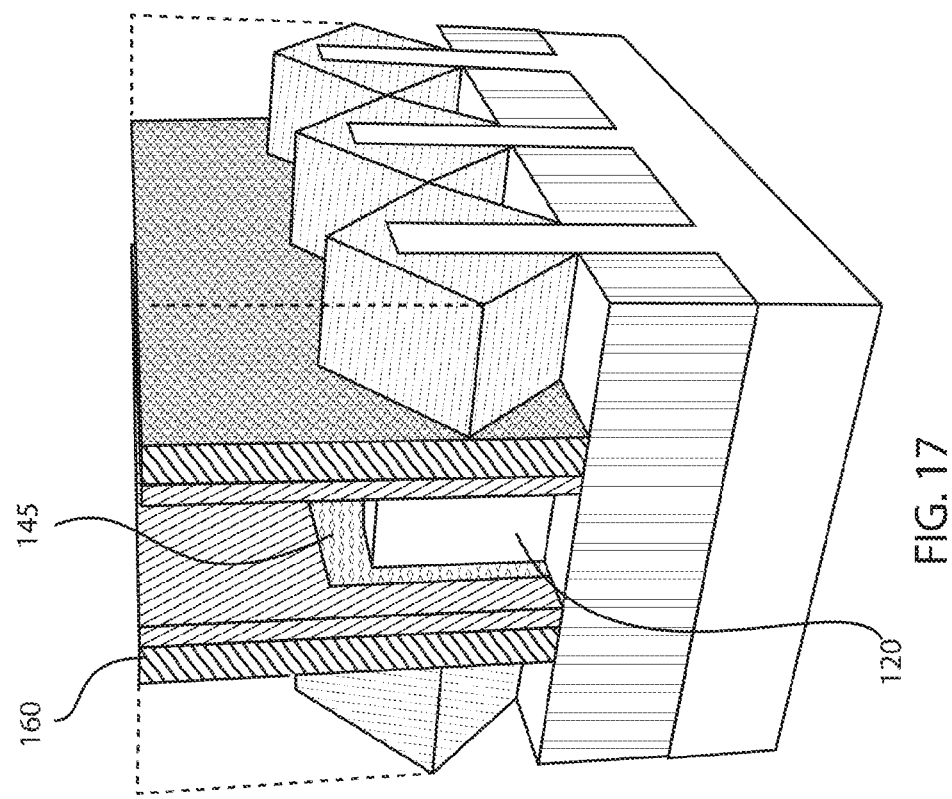
FIG. 18 is a 3D perspective view of a cross-section of a fin, sacrificial gate layer, gate spacer layer and source/drain spacer layer, in accordance with an exemplary embodiment.

FIG. 18 is a 3D perspective view of a cross-section of a fin, sacrificial gate layer, gate spacer layer and source/drain spacer layer, in accordance with an exemplary embodiment.

In one or more embodiments, the portion of the sacrificial gate layer 145 masked by the gate spacer layers 160 remains on a portion of the fin 120. The remaining portion of the sacrificial gate layer 145 may have a width approximately equal to the width of the gate spacer layers 160.

Figure 19:
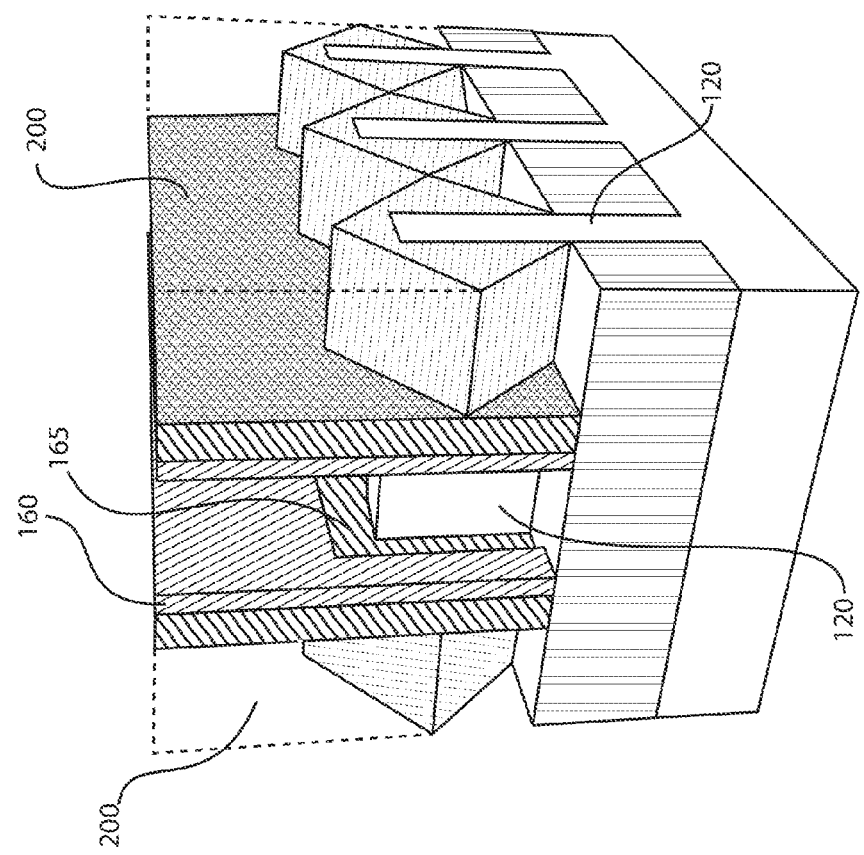
FIG. 19 is a 3D perspective view of an exposed fin after removal of the sacrificial gate layer under the gate spacer layer, in accordance with an exemplary embodiment.

FIG. 19 is a 3D perspective view of an exposed fin after removal of the sacrificial gate layer under the gate spacer layer, in accordance with an exemplary embodiment.

In one or more embodiments, the remaining portion of sacrificial gate layer 145 under each of the gate spacer layer(s) 160 may be removed by an isotropic etch to form a recessed cavity 165 in the gate spacer layer 160, where the isotropic etch may be an isotropic wet etch. The recessed cavity 165 may extend to the inward-facing sidewall of the source/drain spacer layer 170, where the source/drain spacer layer acts as a etch stop for the isotropic etch, which may be a wet etch, for example, a basic oxide etch (BOE). A plurality of recessed cavities 165 may be formed by removing each of the remaining portions of the gate spacer layers 145. The fin 120, sacrificial gate layer 145, dummy gate layer 150, gate spacer layer 160, and source/drain spacer layer 170 may be different materials that are selectively etchable, where, for example, the fin(s) 120 may be crystalline silicon, the dummy gate layer may be an amorphous silicon (a-Si), the sacrificial gate layer 145 may be silicon oxide (SiO), the gate spacer layer 160 may be silicon nitride (SiN), and the source/drain spacer layer 170 may be silicon boron carbonitride (SiBCN), although other material combinations are contemplated.

Figure 20:
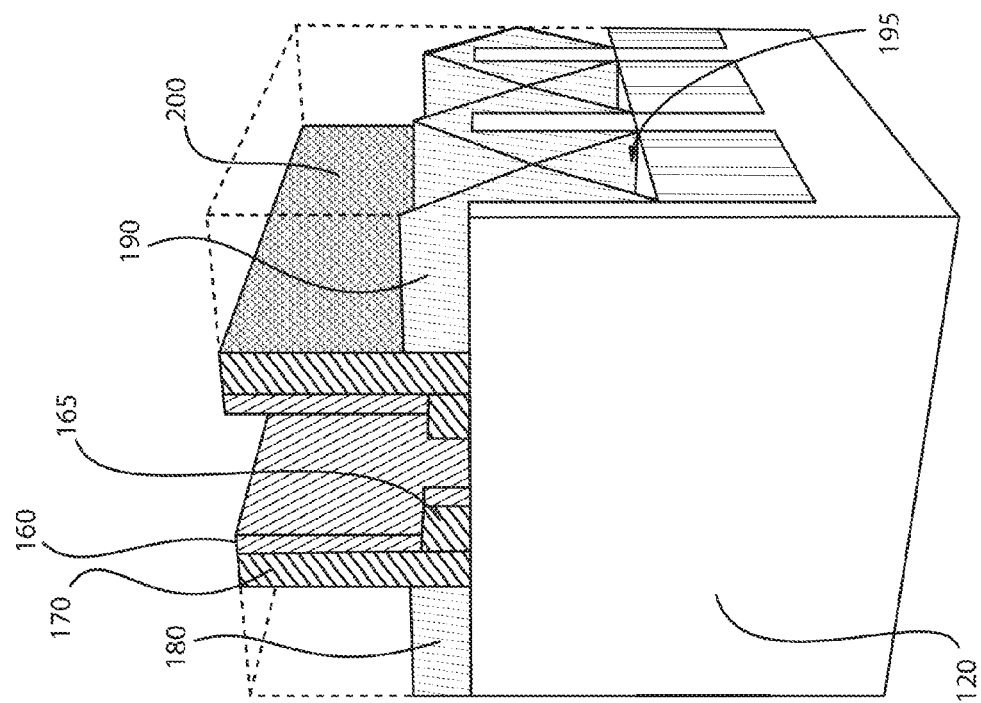
FIG. 20 is a 3D perspective view of a cross-section of a fin, gate spacer layer with a recessed cavity, and source/drain spacer layer, in accordance with an exemplary embodiment.

FIG. 20 is a 3D perspective view of a cross-section of a fin, gate spacer layer with a recessed cavity, and source/drain spacer layer, in accordance with an exemplary embodiment.

In one or more embodiments, the recessed cavity 165 may expose a larger portion of the fin(s) 120, which can increase the portion of the fin(s) on which a gate structure may be formed. The source/drain spacer layer(s) 170 may form a barrier between a subsequently formed gate structure and the source/drain(s) 180, 190, where the source/drain spacer layer 170 may provide electrical insulation between the gate structure and the source/drain(s) 180, 190.

In various embodiments, the height of the recessed cavity 165 is the thickness of the removed sacrificial gate layer 145. In various embodiments, the height of the recessed cavity 165 may be in the range of about 5 nm to about 15 nm, or in the range of about 7 nm to about 10 nm. The recessed cavity may wrap around three sides of a fin.

Figure 21:
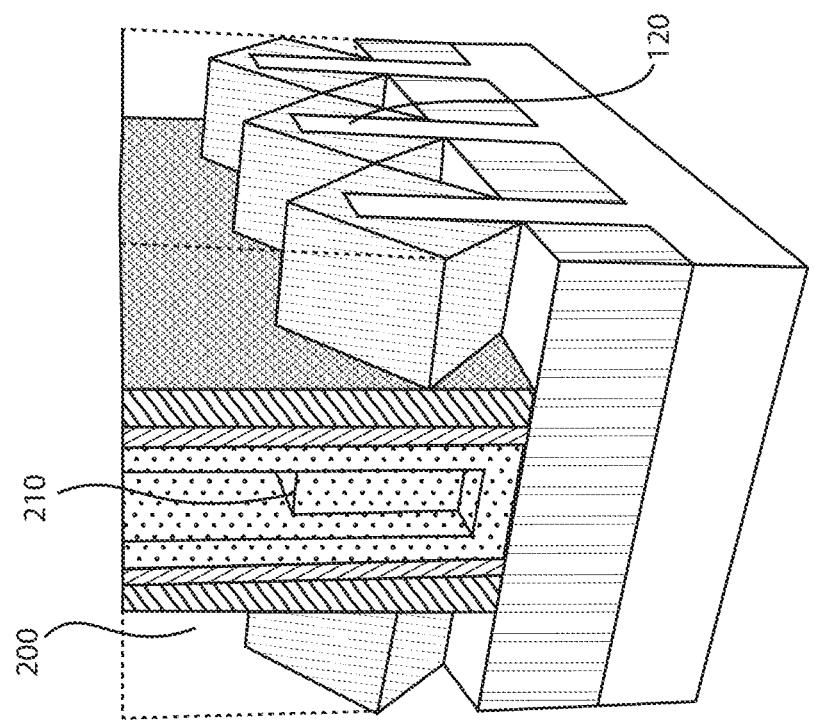
FIG. 21 is a 3D perspective view of a gate dielectric layer on a fin and sidewalls of the gate spacer layers, in accordance with an exemplary embodiment.

FIG. 21 is a 3D perspective view of a gate dielectric layer on a fin and sidewalls of the gate spacer layers, in accordance with an exemplary embodiment.

In one or more embodiments, a gate dielectric layer 210 may be formed over the fin(s) 120 and exposed inward-facing sidewalls of the gate spacer layer 160 to form part of a gate structure on the finFET.

In one or more embodiments, the gate dielectric layer 210 may be a high-K material, including but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAl_1O_3$), zirconium oxide (e.g., $ZrO_2$), zirconium silicon oxide(e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide(e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k dielectric material may further include dopants such as lanthanum and/or aluminum. The stoichiometry of the high-K dielectric material may vary.

Figure 22:
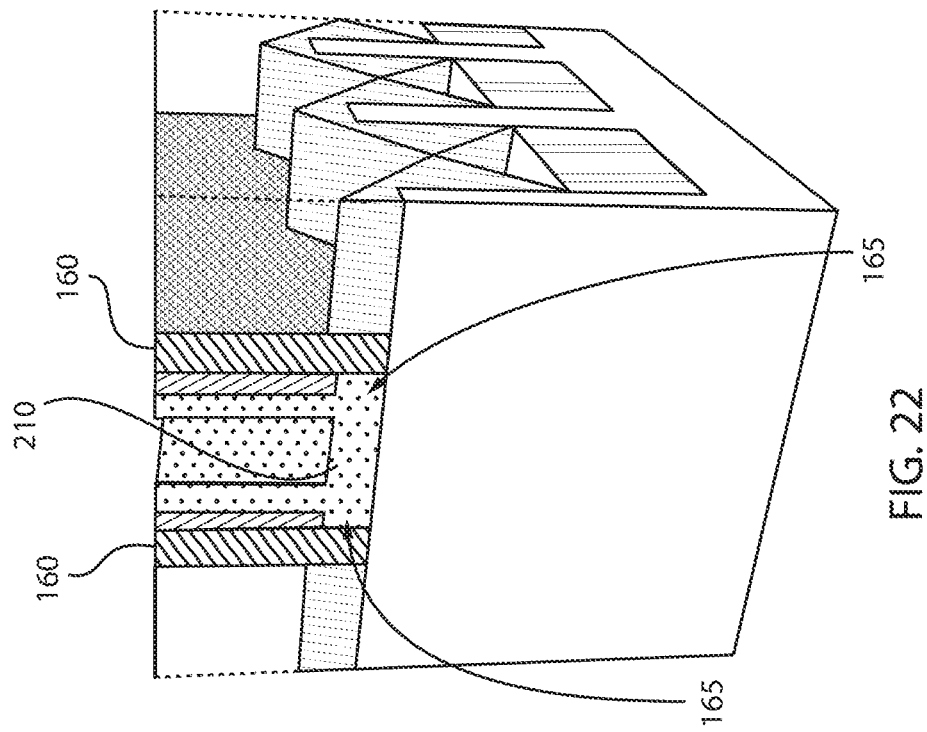
FIG. 22 is a 3D perspective view of a cross-section of a gate dielectric layer on a fin and sidewalls of the gate spacer layers, in accordance with an exemplary embodiment.

FIG. 22 is a 3D perspective view of a cross-section of a gate dielectric layer on a fin and sidewalls of the gate spacer layers, in accordance with an exemplary embodiment.

In various embodiments, the gate dielectric layer 210 may be formed by ALD, CVD, and/or PVD. The gate dielectric layer 210 may fill in the recessed cavity 165 on each end of the gate structure. The gate dielectric layer 210 may fill in at least a portion of the recessed cavity 165 that may form an inverted-T gate structure on the fin(s) 120. The inverted-T shape of the gate trench can provide a greater gate length at the bottom of the trench adjacent to the channel and a narrower gate contact above the channel. The gate dielectric layer may form part of a gate structure on the one or more fin(s) 120, where the gate dielectric layer 210 occupies a plurality of recessed cavities on a fin 120.

Figure 37:
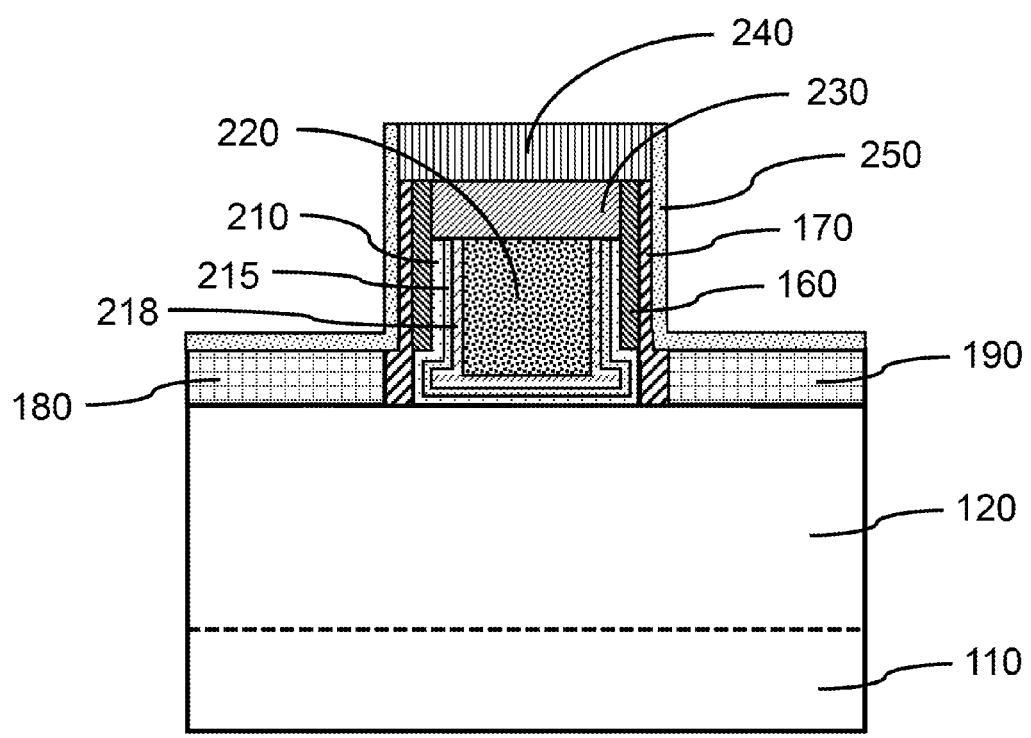
FIG. 37 is a close-up cross-sectional view of a fin with a gate structure and metal liner on source/drains, in accordance with an exemplary embodiment.

In one or more embodiments, a wetting/barrier layer 215 may be formed over the high-K gate dielectric layer 210. The wetting/barrier layer 215 may be titanium nitride (TiN). The wetting/barrier layer 215 may form part of a gate structure on the one or more fin(s) 120, where the wetting/barrier layer 215 occupies at least a portion of the recessed cavities 165 on a fin 120, as shown in FIG. 37.

In one or more embodiments, a work function layer 218 may be formed over the high-K gate dielectric layer 210 and/or wetting/barrier layer 215, where the work function layer 218 may be conformally deposited by ALD, CVD, and/or PVD. In various embodiments, the work function layer 218 may form part of a gate structure on the one or more fin(s) 120, where the work function layer occupies at least a portion of the recessed cavities 165 on a fin 120.

In various embodiments, the work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof. The stoichiometry of the work function layer material may vary.

Figure 23:
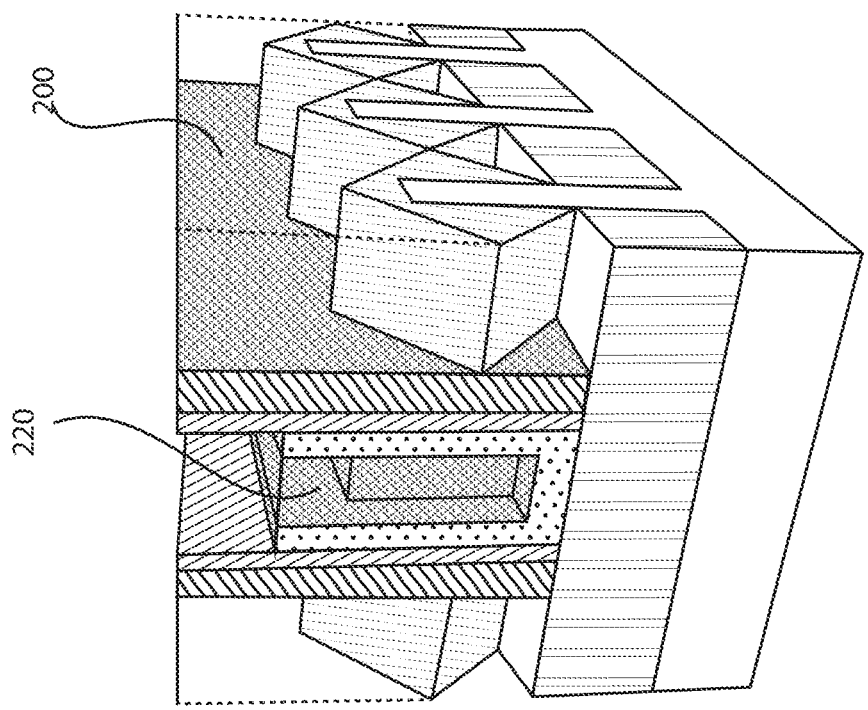
FIG. 23 is a 3D perspective view of a gate metal fill and a gate dielectric layer on a fin and sidewalls of the gate spacer layers, in accordance with an exemplary embodiment.

FIG. 23 is a 3D perspective view of a gate metal fill and a gate dielectric layer on a fin and sidewalls of the gate spacer layers, in accordance with an exemplary embodiment.

In one or more embodiments, a gate metal fill 220 may be formed in the trench between the gate spacer layers 160 above the gate dielectric layer 210. The gate metal fill 220 may form part of a gate structure on a vertical fin forming a FET channel. In various embodiments, the gate metal fill 220 may be polycrystalline silicon (p-Si), tungsten (W), cobalt (Co), molybdenum (Mo), aluminum (Al), or a combination thereof. The gate metal fill 220 may be deposited in the trench by CVD or PVD, where the gate metal fill may be deposited on a work function layer and/or a wetting/barrier layer. The total thickness of the gate metal fill 220 and the work function layer may be in the range of about 6 nm to about 30 nm. In various embodiments, the gate metal fill 220 may be in contact with a gate contact that forms an electrical connection to the outside of the FET.

The high-K gate layer 210, wetting/barrier layer, work function layer, and/or gate metal fill 220 may form a gate structure on the one or more fins, wherein the gate structure occupies the plurality of recessed cavities to form an inverted T-shaped gate structure with a gate length greater than the width of the dummy gate layer.

Figure 24:
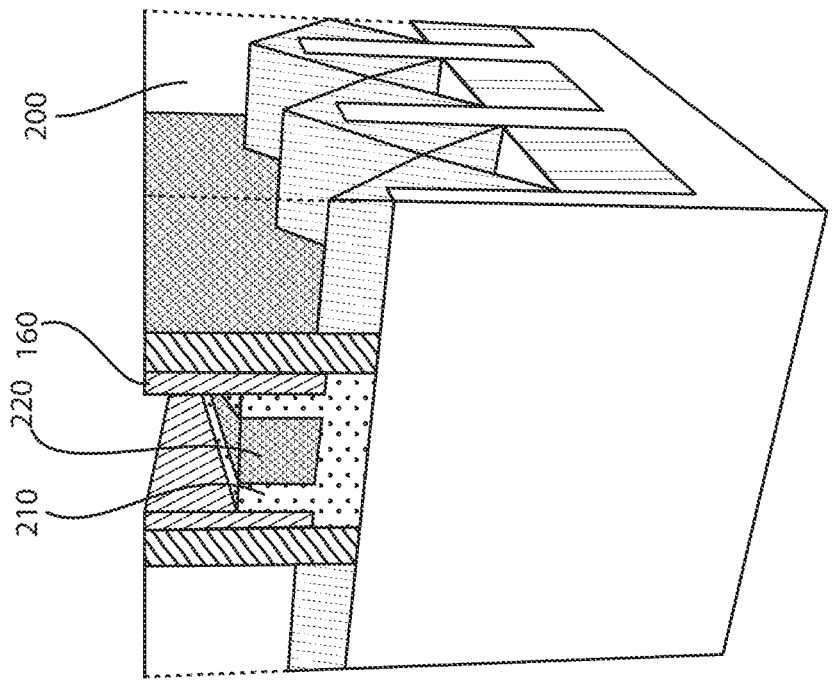
FIG. 24 is a 3D perspective view of a cross-section of a fin with gate metal fill and gate dielectric layer on the fin, in accordance with an exemplary embodiment.

FIG. 24 is a 3D perspective view of a cross-section of a fin with gate metal fill and gate dielectric layer on the fin, in accordance with an exemplary embodiment.

In various embodiments, a portion of the gate metal fill 220 and gate dielectric layer 210 may be removed to reduce the height of the gate metal fill 220 and gate dielectric layer 210 in the trench between gate spacer layers 160. The height of the gate metal fill 220 and gate dielectric layer 210 may be reduced by a directional RIE. A portion of the sidewalls of the gate spacer layers 160 may be exposed proximate to the opening of the trench.

Figure 25:
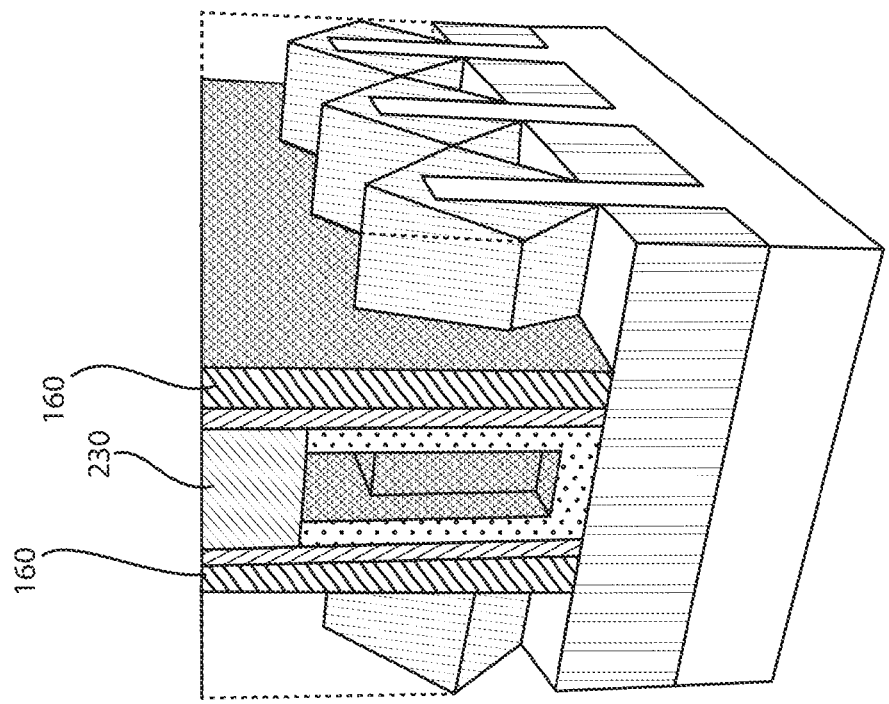
FIG. 25 is a 3D perspective view of a protective cap on the gate dielectric layer and gate metal fill, in accordance with an exemplary embodiment.

FIG. 25 is a 3D perspective view of a protective cap on the gate dielectric layer and gate metal fill, in accordance with an exemplary embodiment.

In one or more embodiments, a protective fill material may be formed on the gate metal fill 220 and gate dielectric layer 210 in the trench. Protective fill material formed above the level of the trench opening may be removed by a chemical-mechanical polishing to form the protective cap 230. In various embodiments, the protective fill material and protective cap 230 may be silicon nitride (SiN). The protective cap 230 may be a self-aligned nitride to protect the gate metal fill 220 from shorting to the source/drain 180, 190.

Figure 26:
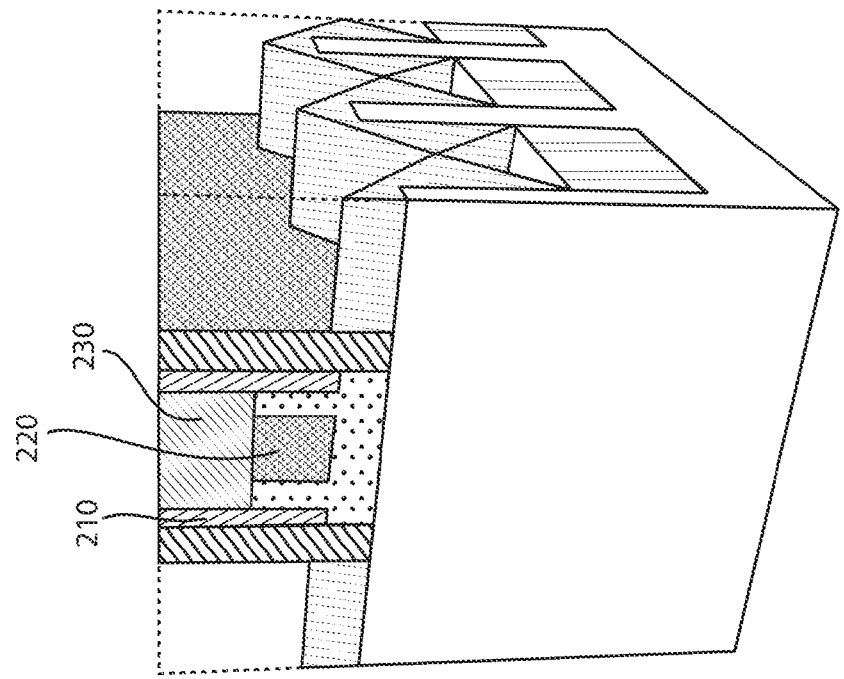
FIG. 26 is a 3D perspective view of a cross-section of a protective cap on the gate dielectric layer and gate metal fill, in accordance with an exemplary embodiment.

FIG. 26 is a 3D perspective view of a cross-section of a protective cap on the gate dielectric layer and gate metal fill, in accordance with an exemplary embodiment.

The gate metal fill may fill the space remaining after formation of the gate dielectric layer 210, wetting/barrier layer, and/or work function layer, to form an electrical contact for the gate structure.

Figure 27:
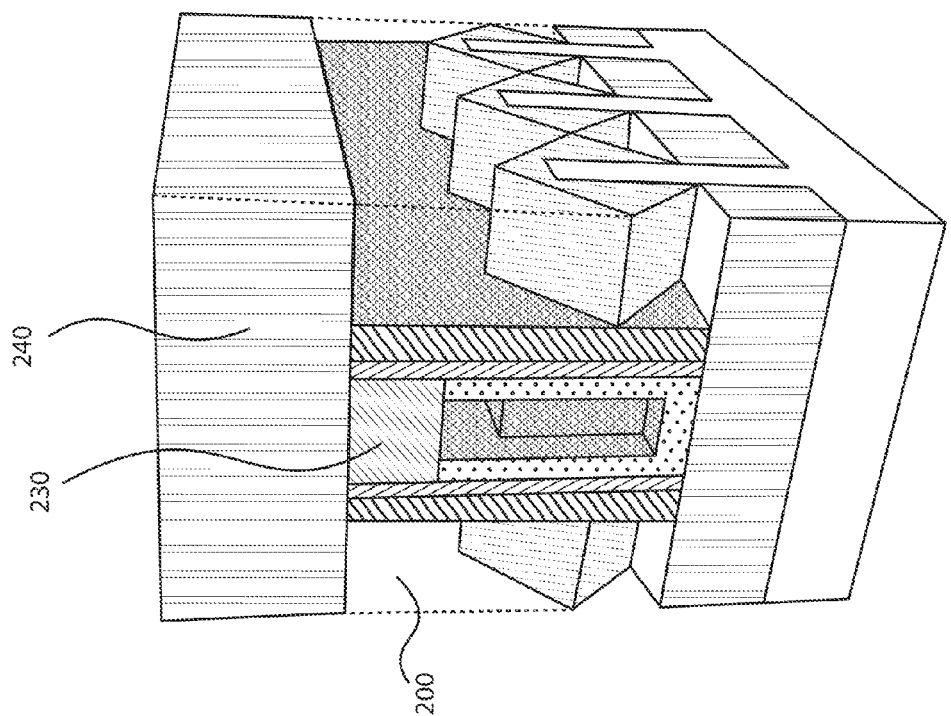
FIG. 27 is a 3D perspective view of a hardmask layer on the protective layer and protective cap, in accordance with an exemplary embodiment.

FIG. 27 is a 3D perspective view of a hardmask layer on the protective layer and protective cap, in accordance with an exemplary embodiment.

In one or more embodiments, a hardmask layer 240 may be formed on the protective layer 200 and protective cap 230. The hardmask layer 240 may be silicon oxide (SiO) formed by an oxide deposition. In various embodiments, the hardmask layer 240 may be a flowable oxide (FOX) formed by a flowable oxide deposition.

Figure 28:
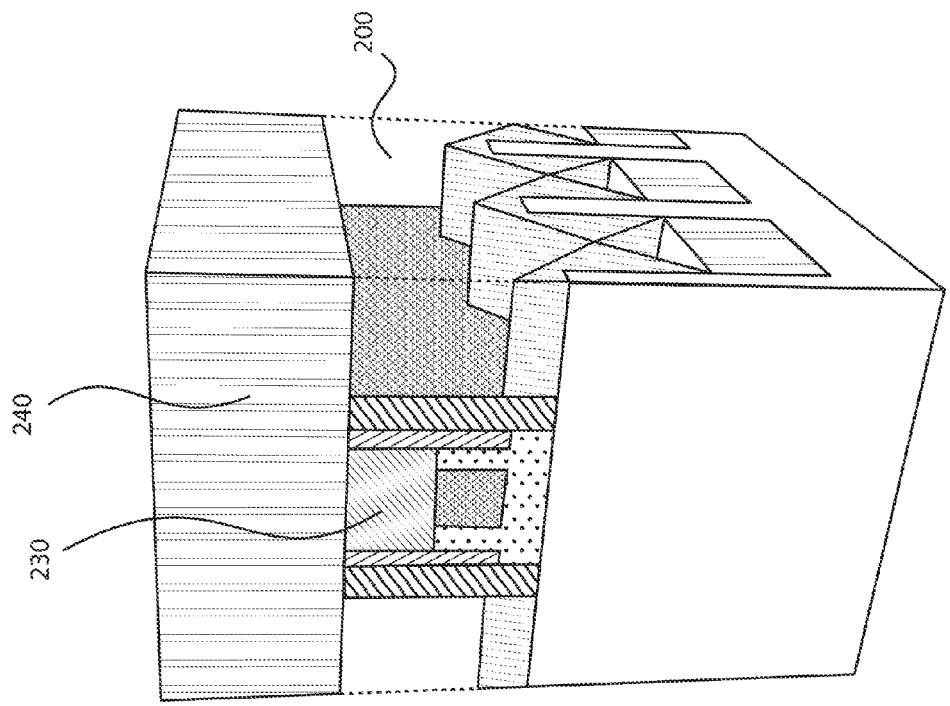
FIG. 28 is a 3D perspective view of a cross-section of a hardmask layer on the protective layer and protective cap, in accordance with an exemplary embodiment.

FIG. 28 is a 3D perspective view of a cross-section of a hardmask layer on the protective layer and protective cap, in accordance with an exemplary embodiment.

The source/drain(s) 180, 190 may be covered by a protective layer 200 and a portion of the hardmask layer 240.

Figure 29:
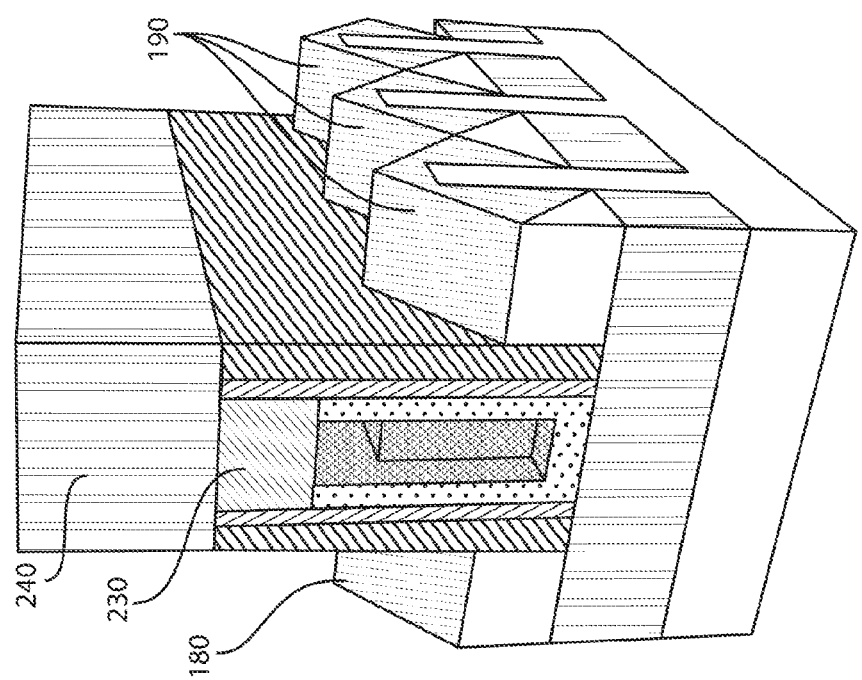
FIG. 29 is a 3D perspective view of a partially removed hardmask layer and protective layer exposing the source/drain(s), in accordance with an exemplary embodiment.

FIG. 29 is a 3D perspective view of a partially removed hardmask layer and protective layer exposing the source/drain(s), in accordance with an exemplary embodiment.

In one or more embodiments, the hardmask layer 240 may be covered with a soft mask layer which is patterned and developed to expose portions of the underlying hardmask layer 240.

In various embodiments, a portion of the hardmask layer 240 and the protective layer 200 may be removed, where the hardmask layer 240 and the protective layer 200 may be removed from over the source/drain(s) 180, 190. Removal of the hardmask layer 240 and the protective layer 200 may expose the source/drain(s) 180, 190 for forming an electrical contact to the source/drain(s) 180, 190.

Figure 30:
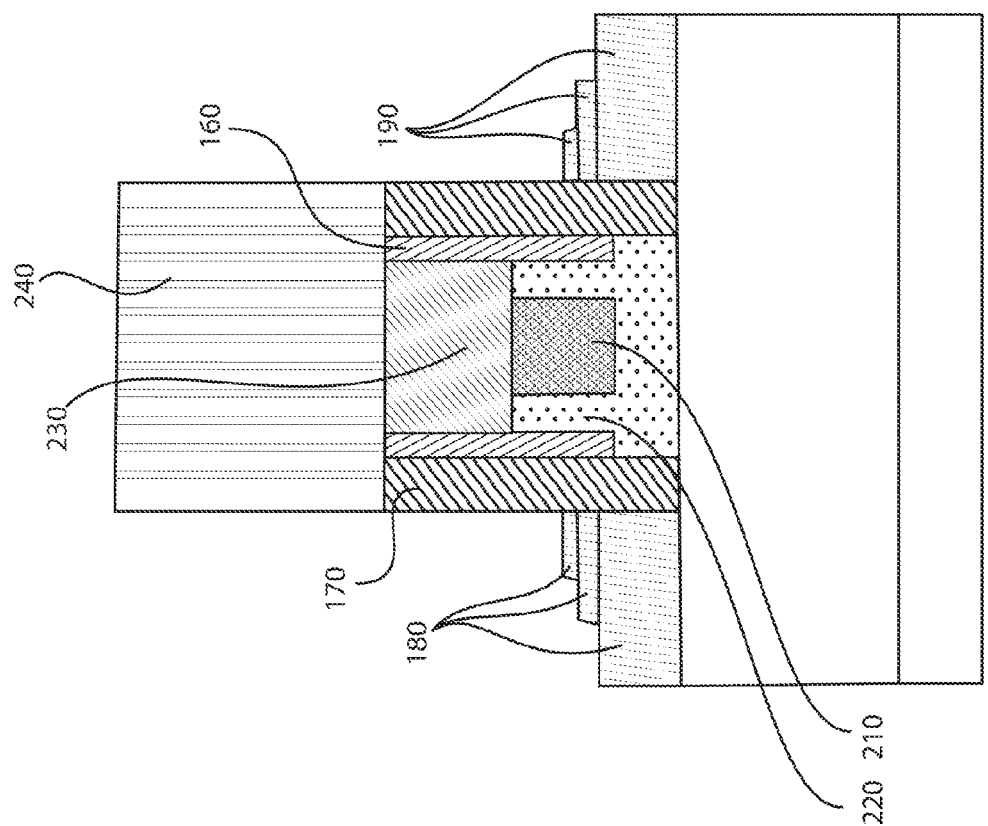
FIG. 30 is a 3D perspective view of a cross-section of a fin with a partially removed hardmask layer and protective layer exposing the source/drain(s), in accordance with an exemplary embodiment.

FIG. 30 is a 3D perspective view of a cross-section of a partially removed hardmask layer and protective layer exposing the source/drain(s), in accordance with an exemplary embodiment.

In one or more embodiments, the source/drain(s) 180 on one side of the gate structure and spacer layers 160, 170 and the source/drain(s) 190 on the opposite side of the gate structure and spacer layers 160, 170 may be exposed by selectively etching the hardmask layer 240 and the protective layer 200, where the hardmask layer 240 and the protective layer 200 may be of the same material. In various embodiments, the hardmask layer 240 and the protective layer 200 may both be silicon oxide that can be etched during a single process (e.g., RIE). The source/drain spacer layer may be silicon nitride (SiN), silicon oxycarbonitride (SiOCN), silicon boron carbonitride (SiBCN), or combinations thereof, that is not etched during removal of the hardmask layer 240 and the protective layer 200.

Figure 31:
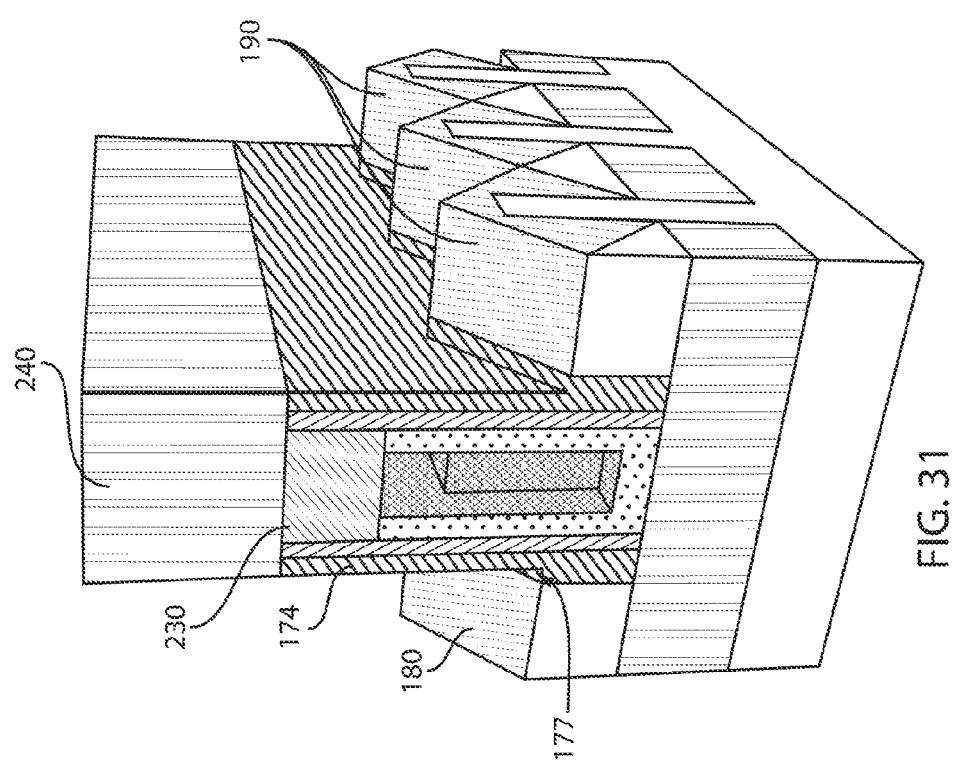
FIG. 31 is a 3D perspective view of a partially removed source/drain spacer layer, in accordance with an exemplary embodiment.

FIG. 31 is a 3D perspective view of a partially removed source/drain spacer layer, in accordance with an exemplary embodiment.

In one or more embodiments, the source/drain spacer layer 170 may be partially removed in a lateral direction to reduce the thickness of the source/drain spacer layer 170 above the level of the source/drain(s) 180, 190 on each side of the gate structure. A vertical portion 174 of the source/ drain spacer layer 170 may be thinned to move a portion of the sidewall away from the source/drain(s) 180, 190. The thinner portion 174 of the source/drain spacer layer 170 may be in the range of about 2 nm to about 4 nm.

A step 177 may be formed in the outward-facing sidewalls of the source/drain spacer layer 170, where the step 177 may be formed in the source/drain spacer layer 170 at the height of the source/drain(s) 180, 190 surfaces, such that the trench for the source/drain contact is wider above the source/drain(s) 180, 190. In various embodiments, the step 177 in the outward-facing sidewalls of the source/drain spacer layer 170 may be at the same height as the top surface of an adjacent source/drain 180, 190 to form a wider trench above the source/drain(s). In various embodiments, the trench above the source/drains 180, 190 may be about 2 nm to about 6 nm wider than the source/drain(s) 180, 190. The wider trench for the source/drain contact can provide a lower resistance for the source/drains of the FET.

In one or more embodiments, a portion of the source/drain spacer layer 170 above the source/drain(s) 180, 190 surfaces may be removed by an isotropic etch, where the etch may be a wet etch. In various embodiments, the wet etch may be a hydrofluoric-hydrochloric acid mix (e.g., 1:1) or a hydrofluoric ethylene glycol (HFEG) mix (e.g., 1:1). The wet etch may provide equivalent etching rates for SiN, SiBCN, SiOCN, and $SiO_2$.

Figure 32:
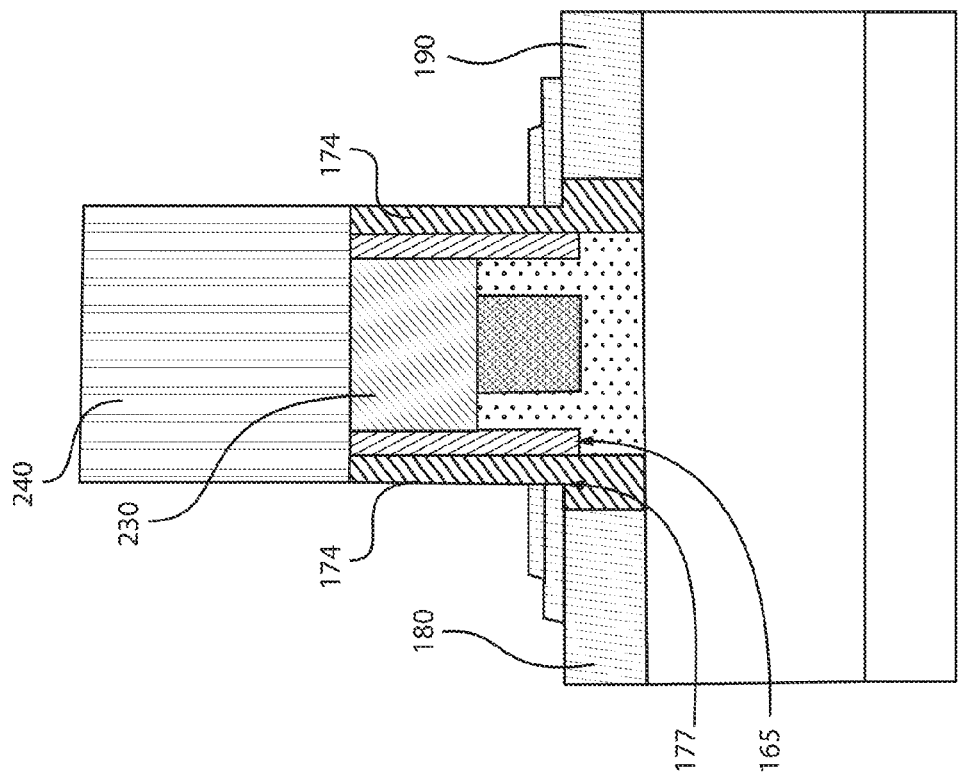
FIG. 32 is a 3D perspective view of a cross-section of a fin and partially removed source/drain spacer layer, in accordance with an exemplary embodiment.

FIG. 32 is a 3D perspective view of a cross-section of a partially removed source/drain spacer layer in accordance with an exemplary embodiment.

In various embodiments, about 1 nm to about 4 nm or about 2 nm to about 3 nm may be removed from the sidewall to thin the portion 174 of the source/drain spacer layer 170 approximately above the top of the recessed cavity 165. The thinned source/drain spacer portion 174 may be about half the thickness of the un-thinned portion, and may provide for a wider source/drain contact, which can result in lower source/drain contact resistance. The source/drain contact may be wider above the level of the gate on the channel portion of the fin 120 to reduce the vertical resistance of the source/drain contact, while avoiding shorts between the gate contact and the source/drain contact to maintain yields with reduced total spacer thickness for gate spacer layer 160 and the thinned source/drain spacer portion 174.

The combination of a wider source/drain contact and a longer gate length can provide a finFET device having lower external resistance without increasing gate leakage and/or device field. The wider source/drain contact and a longer gate length can be formed using fabrication-friendly materials and processes.

Figure 33:
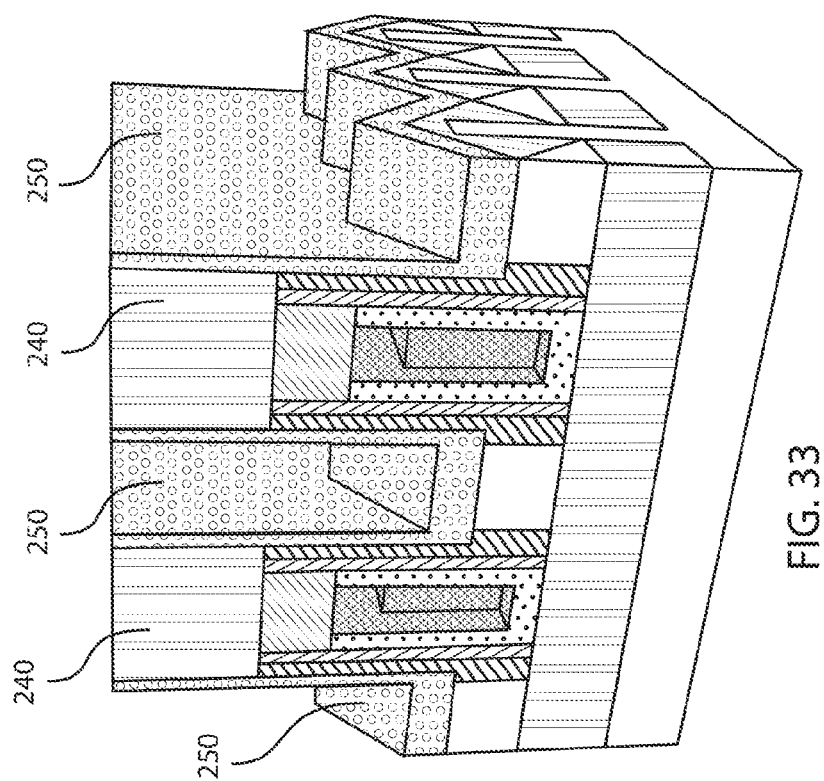
FIG. 33 is a 3D perspective view of a cross-section of source/drain contacts formed on the source/drains, in accordance with an exemplary embodiment.

FIG. 33 is a 3D perspective view of a cross-section of source/drain contacts formed on the source/drains in accordance with an exemplary embodiment.

In one or more embodiments, a metal liner 250 may be formed on each of the source/drains 180, 190, as part of a source/drain contact. The metal liner 250 may be a titanium/titanium nitride (Ti/TiN) bilayer, a nickel-platinum-titanium/titanium nitride (NiPtTi/TiN) bilayer, a nickel/titanium nitride (Ni/TiN) bilayer, a cobalt/titanium nitride (Co/TiN) bilayer, a Ti layer, a TiN layer, a nickel platinum (NiPt) layer, a NiPtTi layer, a Ni layer, a Co layer, or combination thereof.

In various embodiments, a the source/drains 180, 190 may undergo a silicidation and metallization, where the silicon of the source/drains 180, 190 may be reacted with a source/drain contact metal to form a thin silicide layer, and a source/drain contact formed on the silicide layer. The silicide layer may be formed to reduce a source/drain-contact resistance.

In one or more embodiments, a metal liner 250 may be formed on the exposed surfaces of at least one source/drain(s) 180, 190, and outward facing surfaces of the adjacent source/drain spacer layer 170 including a step 177 in the source/drain spacer layer. In various embodiments, the metal liner 250 may be deposited in source/drain contact trenches by PVD. The metal liner 250 may be titanium (Ti), titanium nitride (TiN), nickel platinum (NiPt), or combinations thereof.

The gate pitch (i.e. lateral distance between neighboring fins) may be in the range of about 32 nm to about 64 nm.

Figure 34:
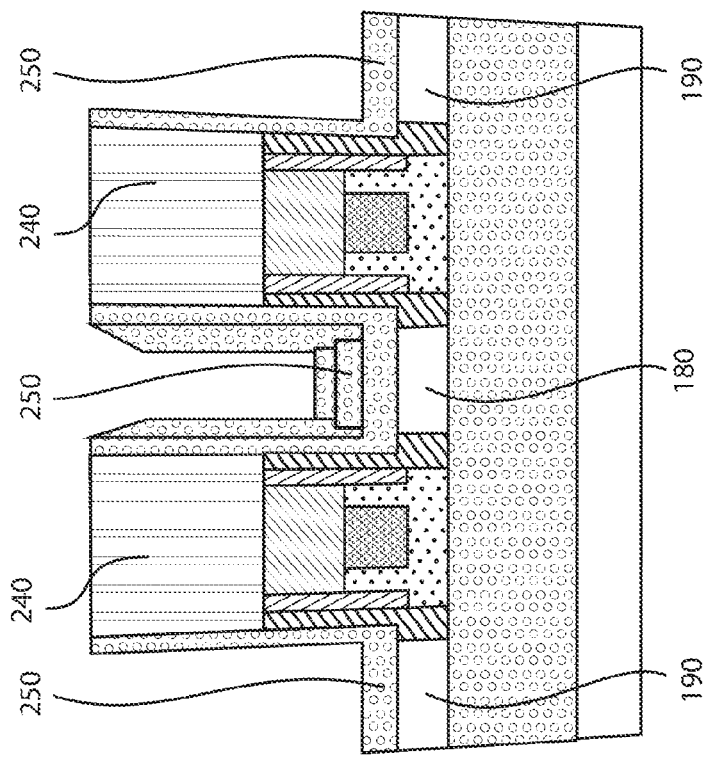
FIG. 34 is a 3D perspective view of a cross-section of two adjacent finFETs sharing a common central source/drain contact, in accordance with an exemplary embodiment.

FIG. 34 is a 3D perspective view of a cross-section of a two adjacent finFETs sharing a common central source/drain contact in accordance with an exemplary embodiment.

In one or more embodiments, a metal liner 250 and source/drain fill may be formed on a source/drain 180, 190 situated between two adjacent finFETs, where the central source/drain 180, 190 may be a common source/drain coupled to both FETs.

In various embodiments, the gate structures formed on the adjacent finFETs sharing the common source/drain may also be coupled to form a multi-fin FET, where the gate structures work in conjunction to control the current through the fins 120 simultaneously in response to an applied signal. This may be extrapolated to multiple finFETs, for example, the three fin-common central source drain depicted in FIGS. 33-36. The arrangement of a common source/drain 180, 190 may be used for both NFETs and PFETs.

Figure 35:
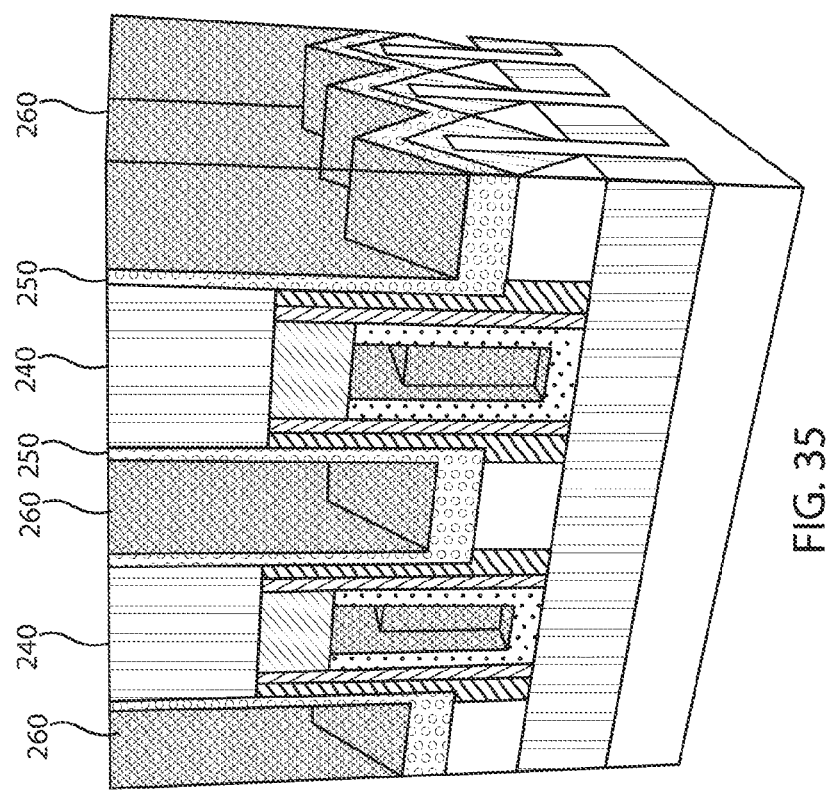
FIG. 35 is a 3D perspective view of two adjacent finFETs sharing a common central source/drain contact with a metal fill on the metal liner, in accordance with an exemplary embodiment.

FIG. 35 is a 3D perspective view of two adjacent finFETs sharing a common central source/drain contact with a metal fill on the metal liner in accordance with an exemplary embodiment.

In various embodiments, a source/drain fill 260 may be formed on the metal liner 250, where the source/drain fill 260 may be tungsten (W). In various embodiments, the source/drain fill 260 may be deposited by CVD or PVD. A chemical-mechanical polishing may be used to remove excess source/drain fill 260 above the surface of the hardmask layer 240.

Figure 36:
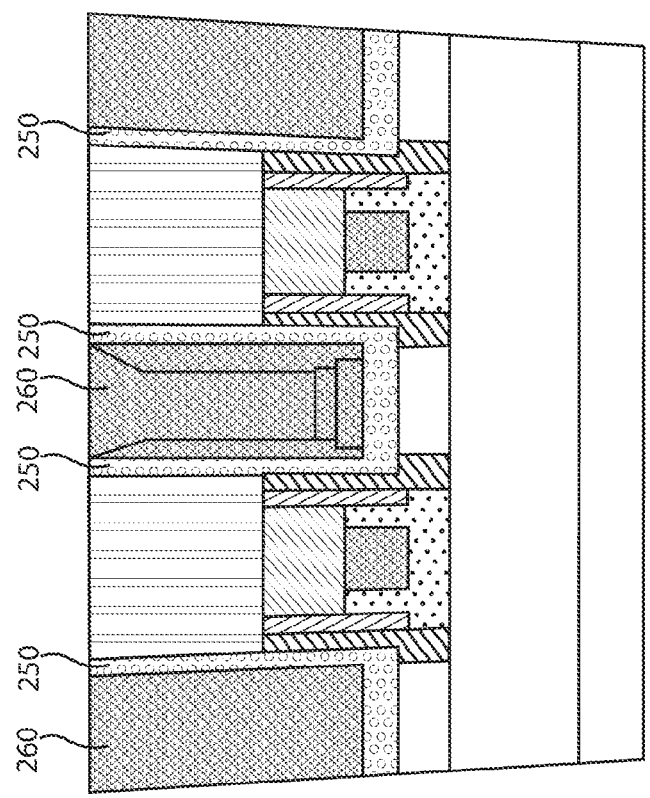
FIG. 36 is a 3D perspective view of a cross-section of two adjacent finFETs with a shared central source/drain between two gate structures, in accordance with an exemplary embodiment.

FIG. 36 is a 3D perspective view of a cross-section of two adjacent finFETs with a shared central source/drain between two gate structures, in accordance with an exemplary embodiment.

In one or more embodiments, two adjacent finFETs may have shared gate structures. A finFET according to various embodiments, may have a single gate or multiple gates, where the gates may be electrically coupled together to form a shared gate. The source/drain fill 260 and metal liner 250 may be electrically isolated from the gate structure in part by source/drain spacer layer 170.

FIG. 37 is a close-up cross-sectional view of a fin with a gate structure and metal liner on source/drains, in accordance with an exemplary embodiment.

In one or more embodiments, a source/drain 180, 190 is formed over the top surface at opposite ends of a fin. A metal liner 250 is formed on the exposed surfaces of the source/drains 180, 190 and on the vertical sidewalls of each source/drain spacer layer 170. The source/drain spacer layer 170 and the gate spacer layer 160 physically and electrically separate the metal liner 250 from the gate structure, where the gate structure includes the gate dielectric layer 210, wetting/barrier layer 215, work function layer 218, and gate metal fill 220. The gate structure may be protected by the protective cap 230 formed on the gate dielectric layer 210, wetting/barrier layer 215, work function layer 218, and gate metal fill 220. The hardmask layer 240 may be on the protective cap 230.

In various embodiments, the gate structure has two different widths due to the recessed cavities 165 formed in the gate spacer layers 160 defining a first distance between the inside surfaces of the source/drain spacer layers 170, and a second distance between the inside surfaces of the two gate spacer layers 160. The metal liner 250 extends laterally onto the step 177 in the source/drain spacer layers 170 forming source and/or drain contacts having a greater length on the fin 120 than the lengths of the source/drains 180, 190 themselves.

An exemplary embodiment of a method of forming a vertical fin field effect transistor (finFET), includes forming one or more fins on a substrate, wherein each of the one or more fins has a long axis parallel to the plane of the substrate; forming a sacrificial gate layer on at least one of the one or more fins; forming a dummy gate layer on the substrate extending in a plane across the long axis of at least one of the one or more fins having a sacrificial gate layer; forming a first gate spacer layer on a first sidewall of the dummy gate layer and forming a second gate spacer layer on a second sidewall of the dummy gate layer opposite the first sidewall; removing at least a portion of the sacrificial gate layer from at least a portion of the one or more fins, forming a source/drain spacer layer on each of the outward-facing sidewalls of the first and second gate spacer layers; removing the dummy gate layer to expose the sacrificial gate layer, and the inward-facing sidewalls of the first gate spacer layer and the second gate spacer layer; removing the portion of the sacrificial gate layer between the inward-facing sidewalls of the first gate spacer layer and the second gate spacer layer; and forming a gate structure between the inward-facing sidewalls of the first gate spacer layer and the second gate spacer layer. The gate structure occupying the plurality of recessed cavities forms an inverted T-shaped gate structure with a gate length greater than the width of the dummy gate layer.

An exemplary embodiment of a fin field effect transistor (finFET) having an inverted-T gate, includes one or more fins extending from a substrate, wherein each of the one or more fins has a long axis parallel to the plane of the substrate; a first gate spacer layer and a first source/drain spacer layer extending in a plane across the long axis of at least one of the one or more fins, wherein the first gate spacer layer is adjacent to the first source/drain spacer layer; a second gate spacer layer and a second source/drain spacer layer extending in a plane across the long axis of at least one of the one or more fins, wherein the second gate spacer layer is adjacent to the second source/drain spacer layer, and the first gate spacer layer is opposite the second gate spacer layer with a space in between; a first recessed cavity in the first gate spacer layer adjacent to the at least one of the one or more fin, and a second recessed cavity in the second gate spacer layer adjacent to the at least one of the one or more fin, wherein the first recessed cavity is opposite the second recessed cavity; and a gate structure formed between the first gate spacer layer and the second gate spacer layer, where a portion of the gate structure fills the first recessed cavity and the second recessed cavity to define a gate length.

Having described preferred embodiments for the fabrication of vertical field effect transistor structure with controlled gate length (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a fin field effect transistor (finFET), comprising:
    forming a temporary gate structure having a sacrificial gate layer and a dummy gate layer on the sacrificial gate layer;
    forming a gate spacer layer on each sidewall of the dummy gate layer;
    forming a source/drain spacer layer on the outward-facing sidewall of each gate spacer layer;
    removing the dummy gate layer to expose the sacrificial gate layer;
    removing the sacrificial gate layer to form a plurality of recessed cavities that exposes an inward facing sidewall of each of the source/drain spacer layers; and
    forming a gate structure, where the gate structure occupies at least a portion of the plurality of recessed cavities.

2. The method of claim 1, wherein the gate structure occupying the plurality of recessed cavities forms an inverted T-shaped gate structure with a gate length greater than the width of the dummy gate layer.

3. The method of claim 1, wherein the sacrificial gate layer is removed using an isotropic wet etch.

4. The method of claim 1, further comprising:
    forming a plurality of source/drains on one or more fins adjacent to the outward-facing sidewalls of the source/drain spacer layers; and
    removing a portion of the outward-facing sidewalls of the source/drain spacer layer to form a step in the outward-facing sidewalls of the source/drain spacer layer.

5. The method of claim 4, wherein the source/drain spacer layer is silicon nitride (SiN), silicon oxycarbonitride (SiOCN), silicon boron carbonitride (SiBCN), or combinations thereof, and has a thickness in the range of about 4 nm to about 8 nm.

6. The method of claim 5, wherein a portion of the source/drain spacer layer is removed using an isotropic wet etch.

7. The method of claim 4, further comprising forming a metal liner on at least one of the plurality of source/drains and the step in the outward-facing sidewalls of the source/drain spacer layer.

8. The method of claim 7, wherein the step in the outward-facing sidewalls of the source/drain spacer layer is at the same height as the top surface of source/drain.

9. The method of claim 7, further comprising forming a source/drain fill on at least a portion of the metal liner, and forming a gate metal fill on at least a portion of the gate dielectric layer.

10. A method of forming a fin field effect transistor (finFET), comprising:
    forming a sacrificial gate layer on one or more fins on a substrate;
    forming a dummy gate layer on at least a portion of the sacrificial gate layer;
    forming a gate spacer layer on the sidewalls of the dummy gate layer;
    removing at least a portion of the sacrificial gate layer from a portion of the one or more fins;

forming a source/drain spacer layer on the outward-facing side rails of the gate spacer layers and the outward-facing sidewalls of the sacrificial gate layer;

removing the dummy gate layer to expose the inward-facing sidewalk of the gate spacer layers and the sacrificial gate layer between the gate spacer layers;

removing the remaining portion of the sacrificial gate layer on the one or more fins to form a plurality of recessed cavities; and forming a gate structure on the one or more fins, wherein the gate structure occupies the plurality of recessed cavities.

11. The method of claim 10, wherein the source/drain spacer layer is silicon nitride (SiN), silicon oxycarbonitride (SiOCN), silicon boron carbonitride (SiBCN), or combinations thereof.

12. The method of claim 10, further comprising forming a plurality of source/drains adjacent to the outward-facing sidewalk of the source/drain spacer layers on at least one of the one or more fins; and removing a portion of the outward-facing sidewalls of each of the source/drain spacer layers to form a step in the outward-facing sidewalls.

13. The method of claim 12, wherein the source/drains are epitaxially grown on at least one of the one or more fins.

14. The method of claim 12, where the step is formed in the outward-facing sidewalls of each of the source/drain spacer layers using an isotropic wet etch.

* * * * *